(12) United States Patent
Senda et al.

(10) Patent No.: US 9,960,213 B2
(45) Date of Patent: May 1, 2018

(54) INPUT AND OUTPUT DEVICE HAVING TOUCH SENSOR ELEMENT AS INPUT DEVICE AND DISPLAY DEVICE

(71) Applicant: Semiconductor Energy Laboratory Co., Ltd., Atsugi-shi, Kanagawa-ken (JP)

(72) Inventors: Naoyuki Senda, Kanagawa (JP); Masataka Nakada, Tochigi (JP); Takayuki Abe, Tochigi (JP); Koji Kusunoki, Kanagawa (JP); Hideaki Shishido, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 14/690,834

(22) Filed: Apr. 20, 2015

(65) Prior Publication Data

US 2015/0311260 A1      Oct. 29, 2015

(30) Foreign Application Priority Data

Apr. 25, 2014   (JP) ................. 2014-091825

(51) Int. Cl.
*H01L 27/32*     (2006.01)
*G06F 3/044*     (2006.01)
(Continued)

(52) U.S. Cl.
CPC ........... *H01L 27/323* (2013.01); *G06F 3/044* (2013.01); *H01L 51/5253* (2013.01);
(Continued)

(58) Field of Classification Search
CPC ... H01L 27/323; H01L 51/5253; G06F 3/044; G06F 3/0412; G06F 3/045; G06F 15/0216
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 0858110 | 8/1998 |
| EP | 1737044 A | 12/2006 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Michael Jung
(74) *Attorney, Agent, or Firm* — Fish & Richardson P.C.

(57) ABSTRACT

A flexible input and output device in which defects due to a crack is reduced. The input and output device includes a first flexible substrate, a second flexible substrate, a first buffer layer, a first crack inhibiting layer, an input device, and a light-emitting element. A first surface of the first flexible substrate faces a second surface of the second flexible substrate. The first buffer layer, the first crack inhibiting layer, and the input device are provided on the first surface side of the first flexible substrate. The first buffer layer includes a region overlapping with the first crack inhibiting layer. The first buffer layer is between the first crack inhibiting layer and the first surface. The input device includes a transistor and a sensor element. The light-emitting element (Continued)

is provided on the second surface side of the second flexible substrate.

19 Claims, 16 Drawing Sheets

(51) Int. Cl.
    *H01L 51/52*       (2006.01)
    *G06F 3/045*       (2006.01)
    *G06F 3/041*       (2006.01)
    *G06F 15/02*      (2006.01)
    *H01L 51/00*       (2006.01)

(52) U.S. Cl.
    CPC ............ *G06F 3/045* (2013.01); *G06F 3/0412* (2013.01); *G06F 15/0216* (2013.01); *H01L 27/322* (2013.01); *H01L 51/0097* (2013.01); *H01L 51/5284* (2013.01); *H01L 2251/5338* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,645,830 B2 | 11/2003 | Shimoda et al. |
| 6,727,522 B1 | 4/2004 | Kawasaki et al. |
| 7,045,438 B2 | 5/2006 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,868,957 B2 | 1/2011 | Yamazaki et al. |
| 8,047,442 B2 | 11/2011 | Yamazaki et al. |
| 8,101,990 B2 | 1/2012 | Tsurume et al. |
| 8,367,440 B2 | 2/2013 | Takayama et al. |
| 8,415,208 B2 | 4/2013 | Takayama et al. |
| 8,936,952 B2 | 1/2015 | Chida |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0032210 A1 | 2/2003 | Takayama et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0007268 A1* | 1/2010 | Kim ................ H01L 27/3227 313/504 |
| 2010/0007632 A1* | 1/2010 | Yamazaki ........... H01L 27/3234 345/175 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0301742 A1 | 12/2010 | Moriwaki |
| 2011/0318889 A1 | 12/2011 | Chida |
| 2012/0043894 A1* | 2/2012 | Koh .................... H01L 27/3269 315/151 |
| 2013/0187161 A1* | 7/2013 | Yamazaki ............. H01L 29/786 257/57 |
| 2013/0299789 A1 | 11/2013 | Yamazaki et al. |
| 2014/0008668 A1* | 1/2014 | Hirakata ................ H01L 27/15 257/79 |
| 2014/0034994 A1 | 2/2014 | Yamane et al. |
| 2014/0306288 A1 | 10/2014 | Adachi et al. |
| 2015/0102300 A1* | 4/2015 | Gong ................. H01L 51/5246 257/40 |
| 2015/0185942 A1* | 7/2015 | Kim ..................... G06F 3/0412 345/173 |
| 2015/0205418 A1* | 7/2015 | Nam ..................... G06F 3/044 345/174 |

(56) References Cited

U.S. PATENT DOCUMENTS

| | | | |
|---|---|---|---|
| 2015/0243711 A1* | 8/2015 | Hong | H01L 27/323 257/40 |
| 2015/0255740 A1 | 9/2015 | Nakada et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-125931 A | 5/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-174153 A | 6/2003 |
| JP | 2004-103957 A | 4/2004 |
| JP | 2004-273614 A | 9/2004 |
| JP | 2004-273732 A | 9/2004 |
| JP | 2009-210719 A | 9/2009 |
| JP | 2010-224426 A | 10/2010 |
| JP | 2011-107556 A | 6/2011 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2005, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn]at Tempratures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystaline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol 92, pp. 072104-1-072104-3.

Park.J et al., "High performance amorphous oxide thin film transistors with self-aligned top-gate structure", IEDM '09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AMOLED Driven by Peald Grown ZnO TFT", IMID '07 Digest 2007, pp. 1249-1252.

Park.Sang-Hee et al., "42.3: Transparent ZnO Thin Film Transistor for the Application of High Aperture Ratio Bottom AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

100

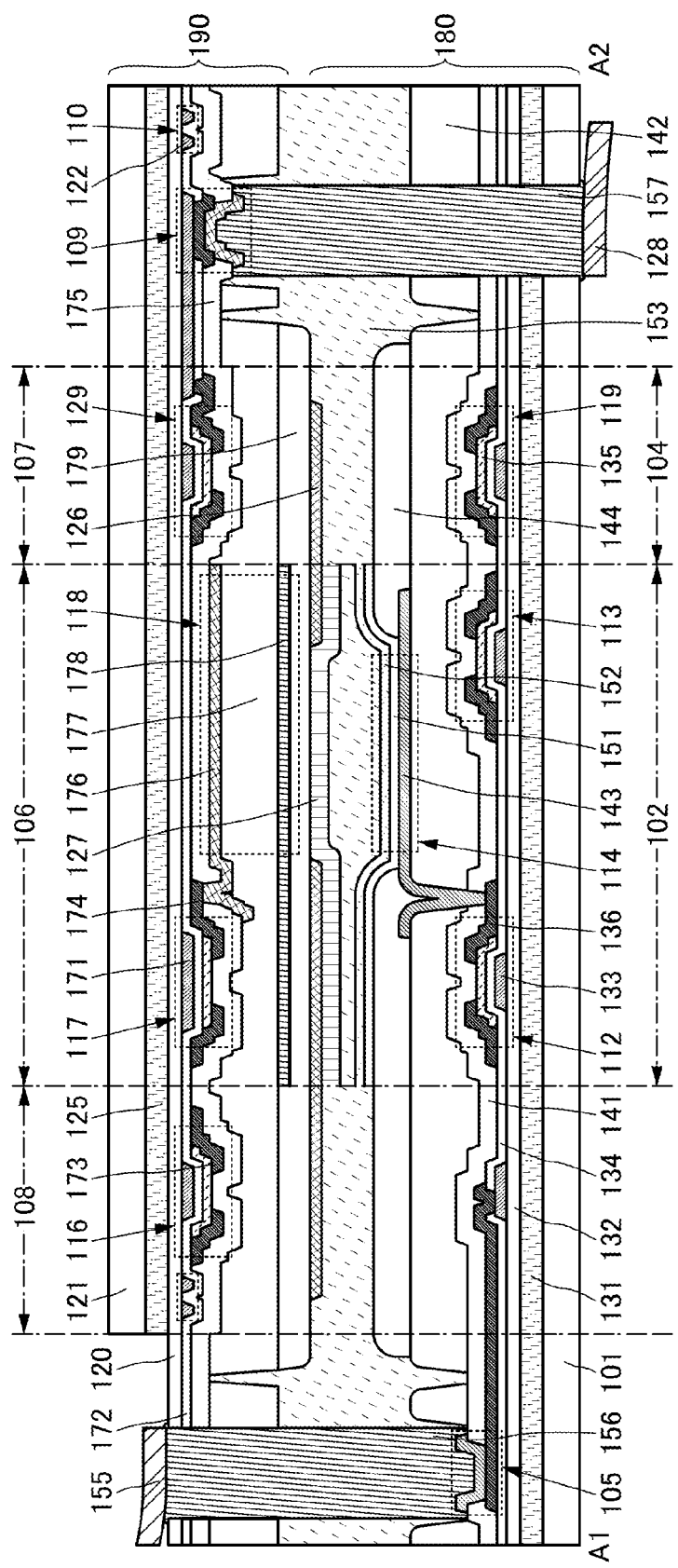

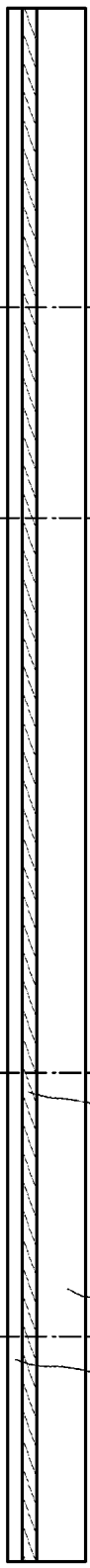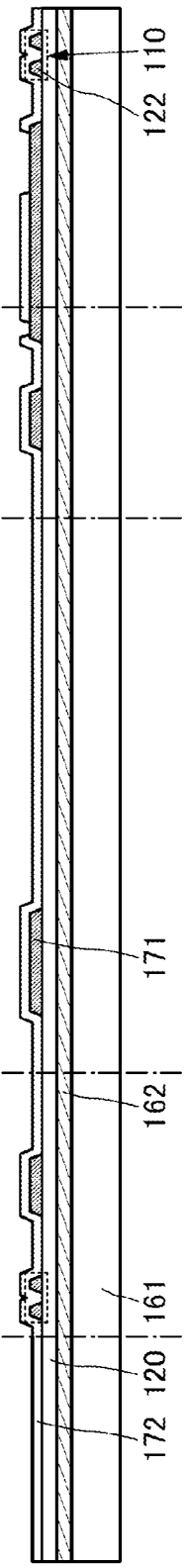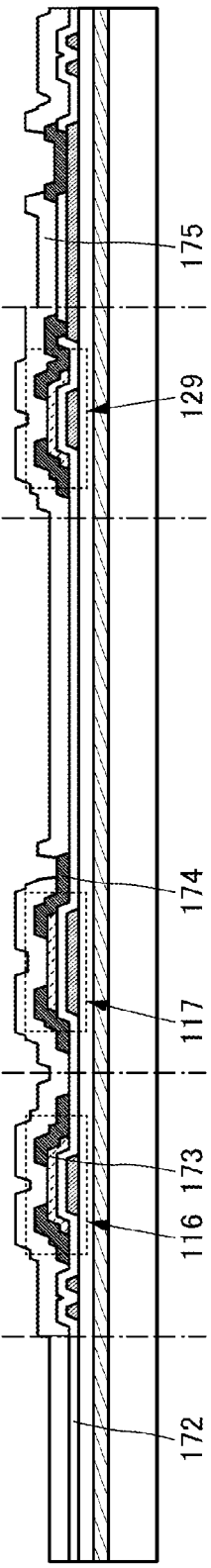

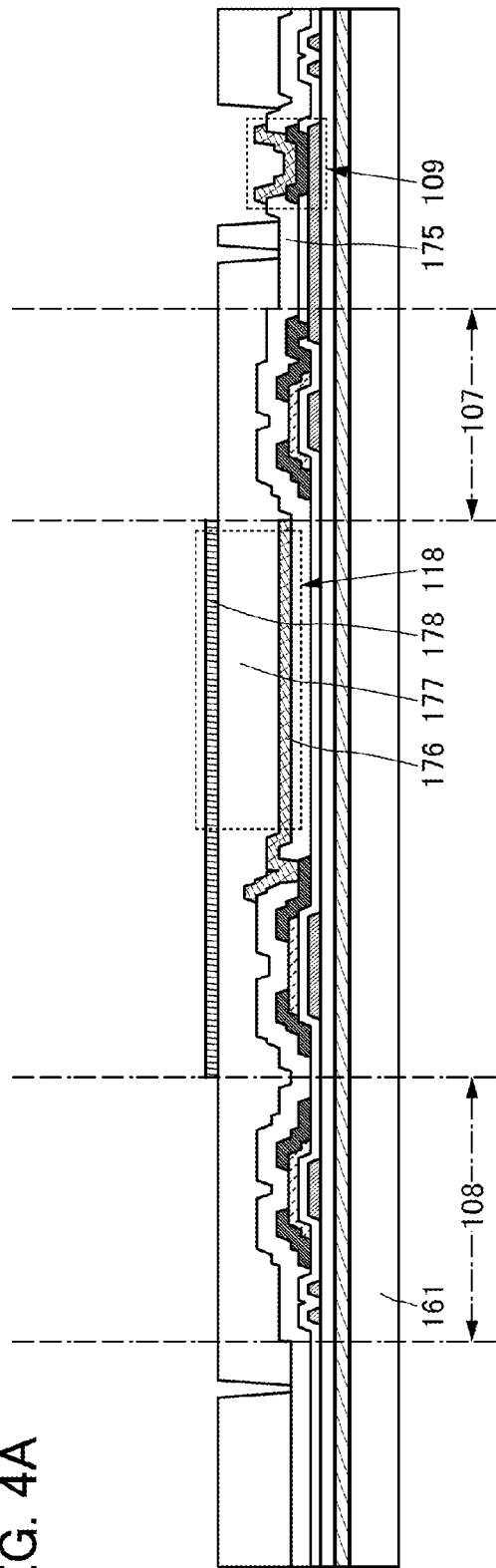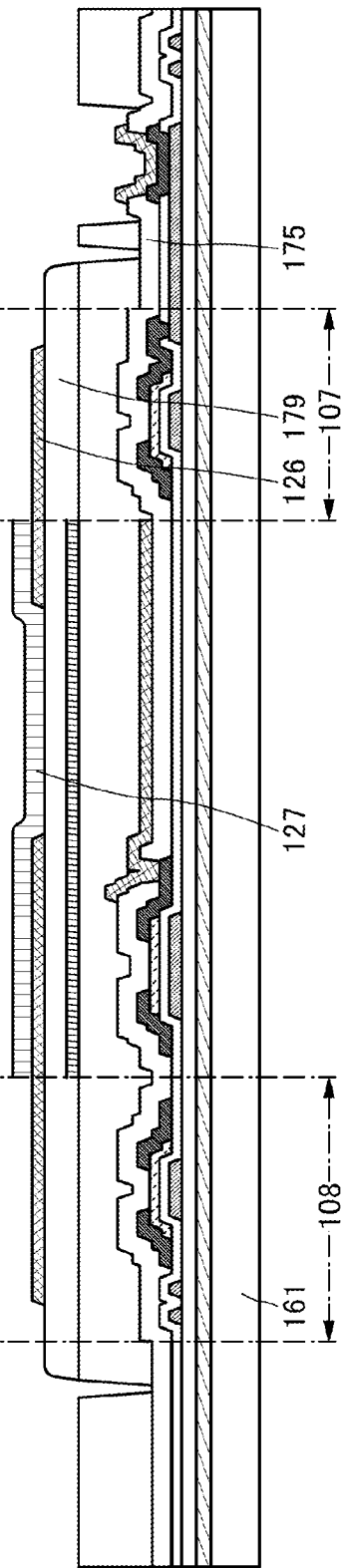

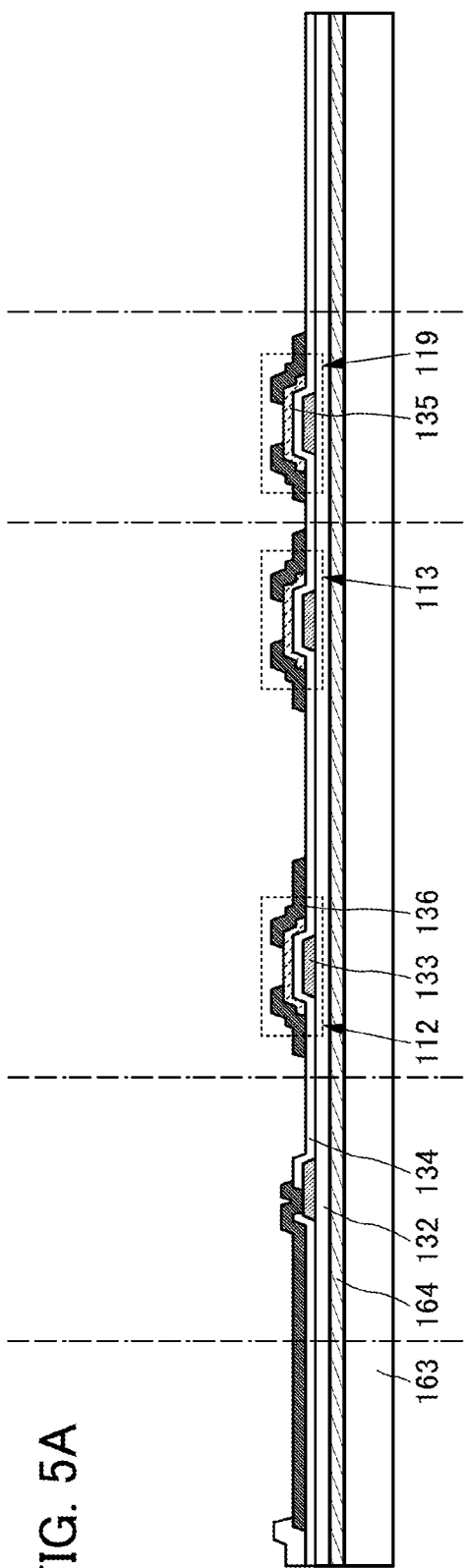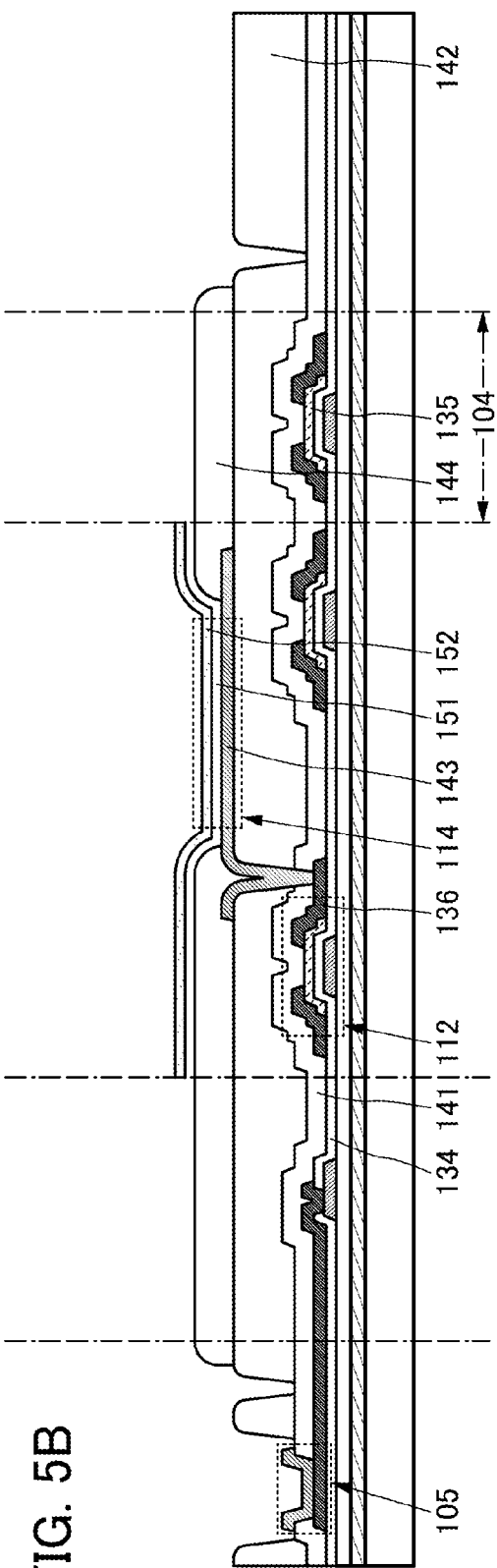

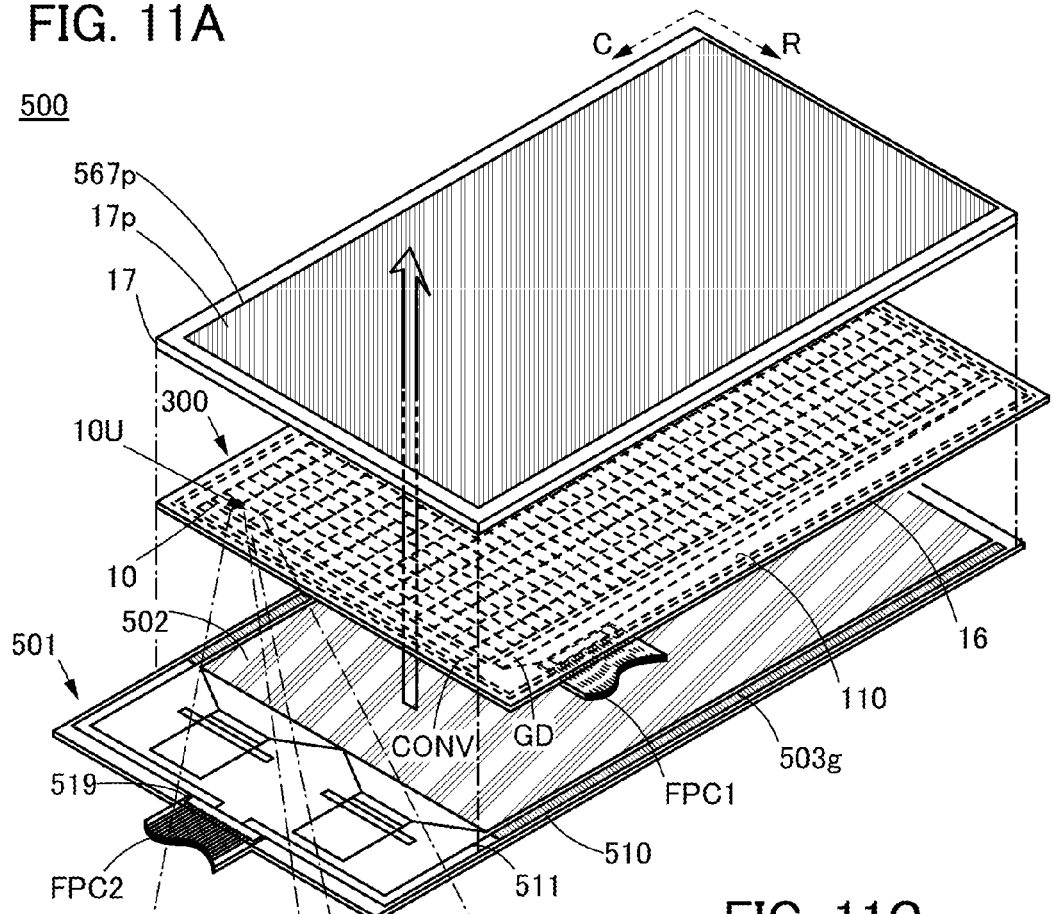
FIG. 11A
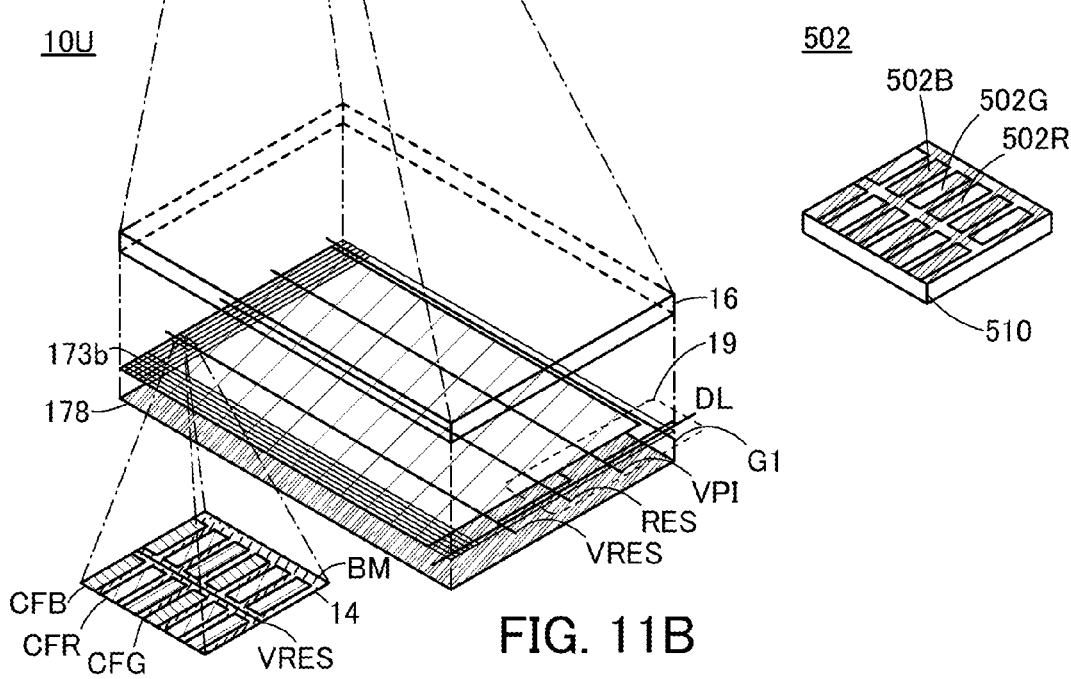
FIG. 11B
FIG. 11C

FIG. 12A
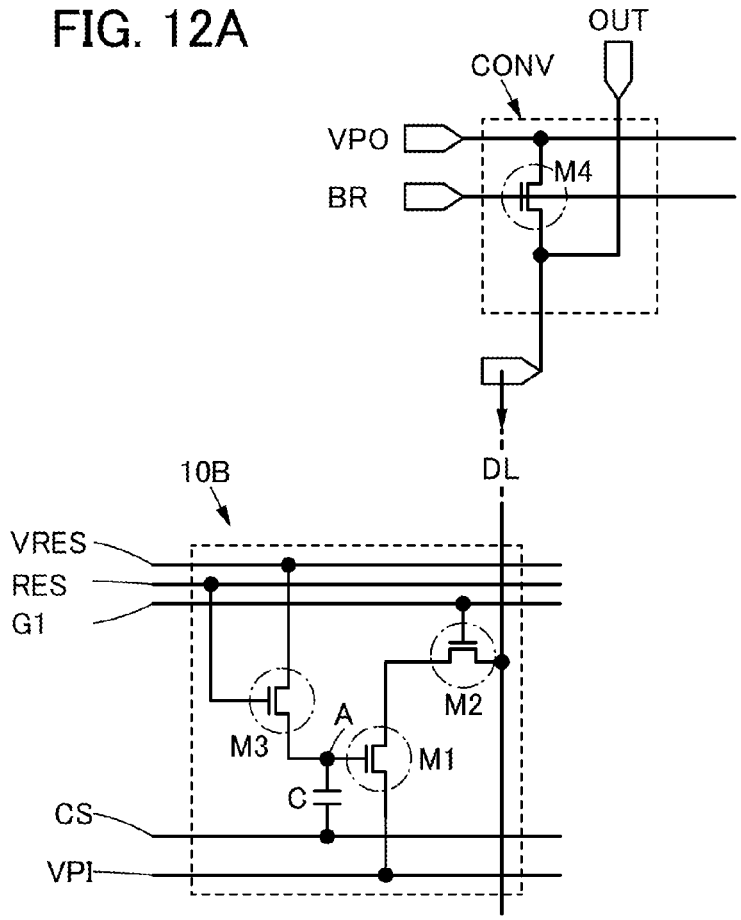
FIG. 12B1
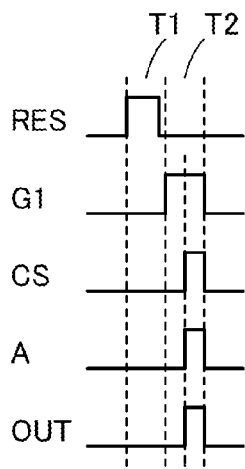
FIG. 12B2
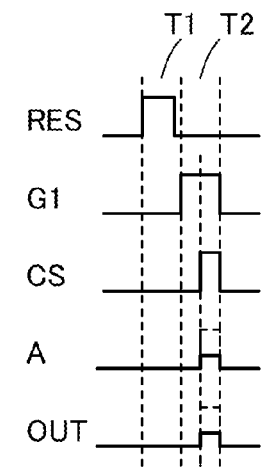
FIG. 12C
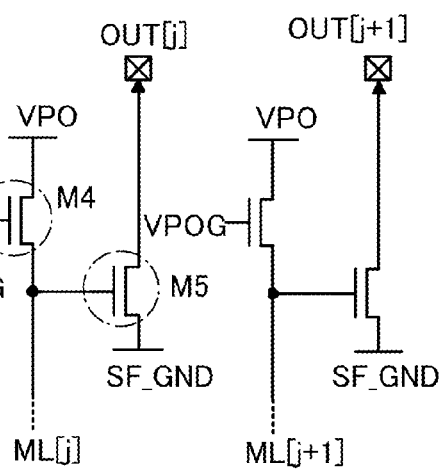

FIG. 16A
150
FIG. 16B
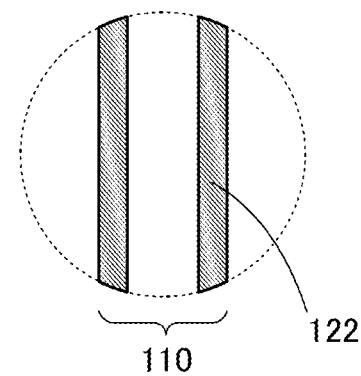
110  122
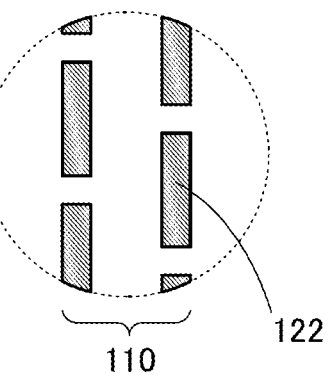
110  122

INPUT AND OUTPUT DEVICE HAVING TOUCH SENSOR ELEMENT AS INPUT DEVICE AND DISPLAY DEVICE

BACKGROUND OF THE INVENTION

1. Field of the Invention

One embodiment of the present invention relates to a display device, and particularly to a flexible display device capable of performing display along a curved surface. One embodiment of the present invention relates to an input and output device and particularly to a flexible input and output device capable of performing display along a curved surface.

Note that one embodiment of the present invention is not limited to the technical field. The technical field of one embodiment of the invention disclosed in this specification and the like relates to an object, a method, or a manufacturing method. One embodiment of the present invention relates to a process, a machine, manufacture, or a composition of matter. Specifically, the technical field of one embodiment of the present invention disclosed in this specification includes a semiconductor device, a display device, a light-emitting device, an electronic device, a method for driving any of them, and a method for manufacturing any of them.

2. Description of the Related Art

In recent years, a flexible device in which a semiconductor element, a light-emitting element, and the like are provided over a flexible substrate has been developed. Typical examples of the flexible device include, as well as a lighting device and an image display device, a variety of semiconductor circuits including a semiconductor element such as a transistor.

As a method of manufacturing a semiconductor device including a flexible substrate, the following technique has been developed: a semiconductor element such as a thin film transistor (TFT) is formed over a support substrate (e.g., a glass substrate or a quartz substrate), and then the semiconductor element is transferred to a flexible substrate. In this technique, a step of peeling a layer including the semiconductor element from the support substrate is needed.

Patent Document 1 discloses a peeling technique using laser ablation as follows. A separation layer formed of amorphous silicon or the like is formed over a substrate, a layer to be peeled is formed over the separation layer, and the peeled layer is bonded to a transfer body with a bonding layer. The separation layer is ablated by laser irradiation, so that separation is generated in the separation layer.

Patent Document 2 discloses the following peeling technique: a metal layer is formed between a substrate and an oxide layer and peeling is generated at an interface between the oxide layer and the metal layer by utilizing weak bonding at the interface between the oxide layer and the metal layer, so that a layer to be peeled and the substrate are separated from each other.

REFERENCE

Patent Document

[Patent Document 1] Japanese Published Patent Application No. H10-125931
[Patent Document 2] Japanese Published Patent Application No. 2003-174153

SUMMARY OF THE INVENTION

In the case where peeling is performed between a separation layer provided over a substrate and a layer to be separated (hereinafter also referred to as a buffer layer) formed over the separation layer, a stack of thin films (e.g., the layer to be separated, a thin film transistor, a wiring, and an interlayer film) is provided over the separation layer. The stack has a thickness of several micrometers or less and is very fragile in some cases. When peeling is performed between the separation layer and the layer to be separated, a high bending stress is applied to an end portion of the substrate (a separation starting point); as a result, breaking or cracking (hereinafter, collectively referred to as a crack) easily occurs in the layer to be separated.

To improve the productivity of a flexible input and output device, it is preferable that a plurality of input and output devices be simultaneously manufactured over a large substrate and the substrate be divided with a scriber or the like. At this time, due to stress applied when the substrate is divided, a crack might occur in a thin film in an end portion of the substrate, particularly in the layer to be separated.

When the flexible light-emitting device that is manufactured in the aforementioned separating and dividing steps is held in a high temperature and high humidity environment, the crack, which occurs in the end portion of the layer to be separated in the separating and dividing steps, develops in some cases. The development of the crack reduces the reliability of light-emitting elements in the input and output device, or some of the light-emitting element emit no light because of the crack reaching the light-emitting elements.

In view of the above, an object of one embodiment of the present invention is to provide a flexible input and output device with fewer defects caused by a crack. Another object is to provide a flexible input and output device with high productivity. Still another object is to provide an input and output device with high reliability.

Another object of one embodiment of the present invention is to provide a novel input and output device. Another object of one embodiment of the present invention is to provide a lightweight input and output device. Still another object of one embodiment of the present invention is to provide an input and output device that is less likely to be broken. Still further object of one embodiment of the present invention is to provide a thin input/output device.

In one embodiment of the present invention, there is no need to achieve all the objects. Note that the descriptions of these objects do not disturb the existence of other objects. Other objects will be apparent from and can be derived from the description of the specification, the drawings, the claims, and the like.

One embodiment of the present invention is an input and output device including a first flexible substrate and a second flexible substrate. The input and output device includes a first buffer layer, a first crack inhibiting layer, an input device, and a light-emitting element. A first surface of the first flexible substrate faces a second surface of the second flexible substrate. The first buffer layer, the first crack inhibiting layer, and the input device are provided on the first surface side of the first flexible substrate. The first buffer layer includes a region overlapping with the first crack inhibiting layer. The input device includes a transistor and a sensor element. The sensor element includes a pair of electrodes and a dielectric layer. The dielectric layer is provided between the pair of electrodes. The transistor and the sensor element are electrically connected to each other. The light-emitting element is provided on the second surface side of the second flexible substrate.

In the input and output device, the second buffer layer and the second crack inhibiting layer may be provided on the second surface side of the second flexible substrate, and the second buffer layer may include a region overlapping with the second crack inhibiting layer.

In the input and output device, it is preferable that the first buffer layer and/or the second buffer layer contain an inorganic material, the light-emitting element contain a light-emitting organic compound, the first crack inhibiting layer and/or the second crack inhibiting layer contain one of a conductive material and a resin material, and the first crack inhibiting layer be positioned between the sensor element and an end portion of the first flexible substrate when seen from a direction perpendicular to the first surface.

In the input and output device, it is preferable that one of the pair of electrodes contain an oxide semiconductor.

In the input and output device, it is preferable that color filter be provided on the first surface side of the first flexible substrate and that one of the pair of electrodes be positioned between the color filter and the second flexible substrate when seen from a direction parallel to the first surface.

In the input and output device, it is preferable that the input and output device include a sealing layer, the sealing layer bond the first surface and the second surface, and one of the pair of electrodes be in contact with the sealing layer.

One embodiment of the present invention is a module including the input and output device and an FPC.

One embodiment of the present invention is an electronic device including the input and output device or the module and one of a speaker, microphone and operation button.

According to one embodiment of the present invention, a flexible input and output device with fewer defects caused by a crack can be provided. Alternatively, a flexible input and output device with high productivity can be provided. An input and output device with high reliability can also be provided.

According to one embodiment of the present invention, a novel input and output device, a lightweight input and output device, an input and output device, that is less likely to be broken, and/or a thin input and output device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIG. 2 illustrates a structure example of an input/output device of one embodiment.

FIGS. 3A to 3C illustrate a method for manufacturing an input/output device of one embodiment.

FIGS. 4A and 4B illustrate a method for manufacturing an input/output device of one embodiment.

FIGS. 5A and 5B illustrate a method for manufacturing an input/output device of one embodiment.

FIGS. 11A to 11C illustrate structure examples of an input/output device of one embodiment.

FIGS. 12A, 12B1, 12B2, and 12C illustrate examples of structures of a sensor circuit and a converter and an example of a driving method thereof

FIGS. 16A and 16B illustrate structure examples of an input/output device of one embodiment.

DETAILED DESCRIPTION OF THE INVENTION

Figure 1:
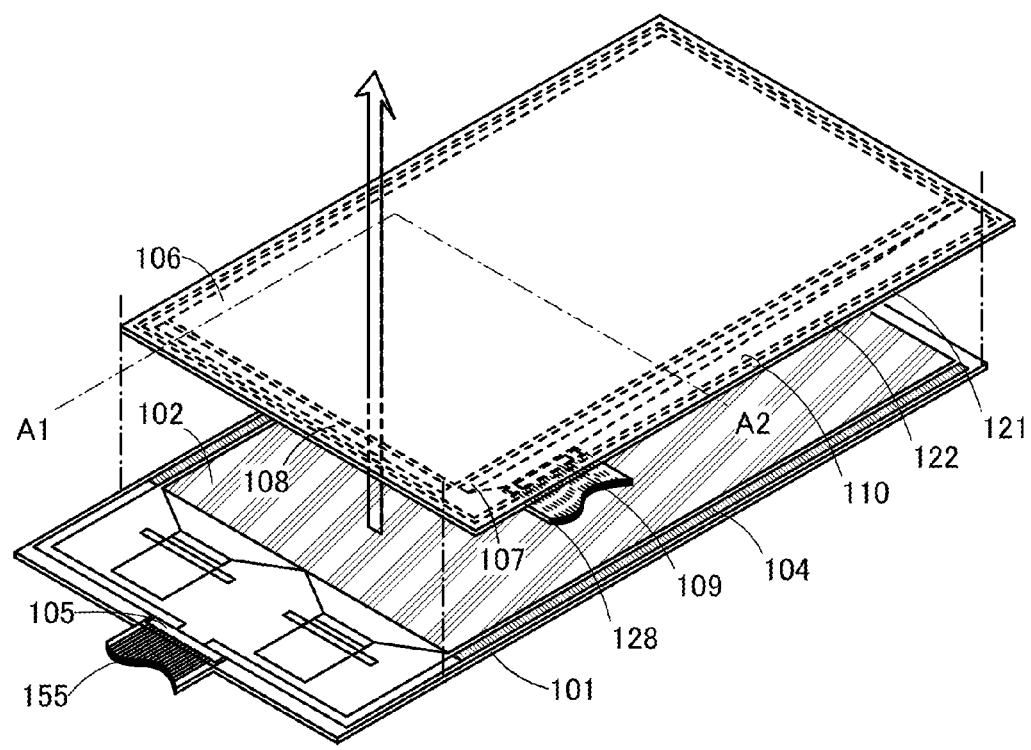
FIG. 1 illustrates a structure example of an input/output device of one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the present invention described below, the same portions or portions having similar functions are denoted by the same reference numerals in different drawings, and the description thereof is not repeated in some cases. The same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Embodiment 1

In Embodiment 1, an example of an input and output device (also referred to as input/output device) of one embodiment of the present invention is described. A structure and a manufacturing method of a touch panel in which an image display device is incorporated with an input device will be described with reference to drawings.

An example of the image display device in Embodiment 1 is a touch panel including an organic electroluminescence (EL) element.

[Structure Example of Touch Panel]

FIG. 1 is a projection view illustrating a structure of a touch panel 100 which is one embodiment of the present invention. FIG. 2 is a cross-sectional view of the touch panel 100 taken along dashed-dotted line A1-A2 in FIG. 1. Note that some components are not illustrated in FIG. 1 and FIG. 2 for clarity.

The touch panel 100 includes an image display device 180 and an input device 190 (see FIG. 2).

The touch panel 100 includes, on a surface of a first substrate 121 opposite to a second substrate 101, a sensor portion 106, a scan line driver circuit 107, a converter 108, an external connection terminal 109, and a crack inhibiting region 110. The crack inhibiting region 110 surrounds the sensor portion 106.

The crack inhibiting region 110 includes at least one crack inhibiting layer that will be described later.

In the touch panel 100, the first substrate 121 and the second substrate 101 face each other with a sealing layer 153 sandwiched therebetween. A first buffer layer (also referred to as a layer to be separated, and hereinafter simply referred to as a buffer layer) 120 is provided on the first substrate 121 with a bonding layer 125 provided therebetween. On the buffer layer 120, transistors 116, 117, and 129 and a sensor element 118 included in the sensor portion and the converter are provided. In addition, on the buffer layer 120, the crack inhibiting region 110 including a plurality of crack inhibiting layers 122 is provided. A second buffer layer 132 is provided over the second substrate 101 with a bonding layer 131 sandwiched therebetween. A light-emitting element 114 functioning as a display element, transistors included in a display portion 102, a scan line driver circuit 104, and the like, and an external connection terminal 105 are provided on the second buffer layer 132.

Note that the first substrate 121 and the second substrate 101 are preferably flexible.

The buffer layer 120 and the second buffer layer 132 inhibit diffusion of impurities that have passed through the substrates (the first substrate 121 and the second substrate 101) and the bonding layers (the bonding layers 125 and 131), to the transistors, the light-emitting element 114, and the like.

The buffer layer 120 serves as a barrier film preventing diffusion of impurities to the light-emitting element 114. The buffer layer 120 can be, for example, a single film of an inorganic material or a laminated film of the inorganic materials. The use of such a material increases the moisture-proof property of the touch panel even when the barrier property particularly moisture-proof property of the material used for the first substrate 121 is low.

However, brittle fracture easily occurs in the inorganic film, which might cause a crack in the buffer layer 120 when, for example, the touch panel 100 is bent. In addition, the inorganic film with low moisture permeability has a low swelling ratio. A layer in the vicinity of the buffer layer 120 thus swells more than the buffer layer 120 when the touch panel 100 is placed in a high temperature and high humidity environment, for example. As a result, stress concentration may occur at the interface between the buffer layer 120 and the adjacent layer, causing a crack.

This crack generated in the buffer layer 120 can be hindered by the crack inhibiting layers 122 which are made of a material different from that of the inorganic film included in the buffer layer 120 and are in contact with the buffer layer 120.

The crack inhibiting layers 122 are preferably formed using a conductive film that has higher ductility and a lower swelling ratio than the inorganic film.

Furthermore, the crack inhibiting layers 122 are preferably formed of a resin material that has high adhesion to the inorganic film, in which case stress concentration on the surface of the buffer layer 120 can be reduced at the interface between the crack inhibiting layers 122 and the buffer layer 120.

The crack inhibiting region 110 includes the two crack inhibiting layers 122. As illustrated in FIG. 1, each of the crack inhibiting layers 122 is a closed curve (also referred to as a loop or a curve with no ends) when seen from above, by which the sensor portion 106 is surrounded. The crack inhibiting layer 122 may be a closed curve (also referred to as a loop or a curve with no ends) when seen from above, by which surround the sensor portion 106 and the external connection terminal 109.

In the case where a plurality of touch panels 100 are simultaneously formed over a large substrate and then divided into each, the crack inhibiting region 110 surrounding the sensor portion 106 can prevent a crack in an end portion of the buffer layer 120 from developing across the crack inhibiting region 110.

In addition, the touch panel 100 can be manufactured through the step of separating a support substrate as described later. During the separation, a crack generated in the buffer layer 120 from an end portion of the substrate can be prevented from developing across the crack inhibiting region 110.

Although the crack inhibiting layer 122 in this structure example is formed over the surface of the first substrate 121, that is, on the first buffer layer 120, and surrounds the sensor portion 106, the crack inhibiting layer may be formed over the surface of the second substrate 101. When the crack inhibiting layer 122 is formed on the second buffer layer 132 and surrounds the display portion 102, development of a crack generated in the buffer layer 132 can be inhibited. Alternatively, the crack inhibiting layer may be formed over the surfaces of the first substrate 121 and the second substrate 101.

The crack inhibiting region 110 is not necessarily provided to be a closed curve and may be divided into plural lines (see FIG. 16B), though the crack inhibiting region 110 in FIG. 1 and FIG. 2 is a closed curve surrounding the sensor portion 106 (see FIG. 16A). Note that FIG. 16A is an enlarged top view of the crack inhibiting region 110 in the region 150 surrounded by the dashed line in FIG. 1. FIG. 16B is an enlarged top view of the divided crack inhibiting layers 122 included in the crack inhibiting region 110.

Other components of the touch panel 100 will be described with reference to FIG. 1 and FIG. 2.

The external connection terminal 105 is preferably formed using the same material as a conductive layer included in the transistors (transistors 112, 113, and 119) or the light-emitting element 114 of the image display device 180, in which case the manufacturing process can be simplified. In this structure example, the external connection terminal 105 is formed using the same material as a first electrode 143 and an electrode 136 which forms a source or drain electrode of the transistor. A signal can be input to the image display device 180 when a flexible printed circuit (FPC) or an IC is mounted on the external connection terminal 105 via an anisotropic conductive film (ACF), an anisotropic conductive paste (ACP), or the like. In this example, an FPC 155 is provided via a connector 156.

An FPC 128 is connected to the external connection terminal 109 of the input device 190 via a connecter 157.

In the example shown in FIG. 2, the transistor 119 is included in the scan line driver circuit 104 of the image display device 180. The scan line driver circuit 104 may be, for example, a circuit in which an n-channel transistor and a p-channel transistor are used in combination, or a circuit that is formed of either n-channel transistors or p-channel transistors. In this structure example, the scan line driver circuit 104 is formed over the second buffer layer 132, over which the display portion 102 is formed, and a signal line driver circuit is mounted on the second substrate 101 using a driver circuit IC. However, a scan line driver circuit and a signal line driver circuit may be formed over the second buffer layer 132, i.e., a driver integrated type.

FIG. 2 also illustrates a cross-sectional structure for one pixel as an example of the display portion 102. The pixel includes the current-control transistor 112, the switching transistor 113, and the first electrode 143 electrically connected to one of the pair of electrodes 136 of the current control transistor 112. An insulating layer 144 is provided to cover an end portion of the first electrode 143.

In this structure example, the transistors 112, 113, and 119 in the image display device 180 are bottom-gate transistors. Each of the transistors includes a semiconductor layer 135 having a region serving as a channel, a gate electrode 133, and an insulating layer 134 serving as a gate insulating film. In addition, the pair of electrodes 136 are provided in contact with the semiconductor layer 135. An insulating layer 141 and an insulating layer 142 are provided to cover the semiconductor layer 135 and the electrodes 136. Note that in the semiconductor layer 135, low-resistance regions may be provided with the region serving as a channel interposed therebetween.

The light-emitting element 114 includes the first electrode 143, an EL layer 151, and a second electrode 152 which are stacked in this order over the insulating layer 142. Since the image display device 180 shown in this structure example is a top emission display device, a light-transmitting material is used for the second electrode 152. A reflective material is preferably used for the first electrode 143. The EL layer 151 contains at least a light-emitting organic compound. When voltage is applied between the first electrode 143 and the second electrode 152 with the EL layer 151 sandwiched therebetween so that current can flow in the EL layer 151, the light-emitting element 114 can emit light.

The first substrate 121 and the second substrate 101 face to each other and are bonded with the sealing layer 153.

In this example, the transistors 116, 117, and 129 in the input device 190 are bottom-gate transistors similar to the transistor 112 and the like. Each of the transistors includes a semiconductor layer 173 having a region serving as a channel, a gate electrode 171, and an insulating layer 172 serving as a gate insulating film. Moreover, the pair of electrodes 174 are provided in contact with the semiconductor layer 173, and an insulating layer 175 is provided to cover the semiconductor layer 173 and the electrodes 174. Note that in the semiconductor layer 173, low-resistance regions may be provided with the region serving as a channel interposed therebetween. Note that the transistors included in the input device 190 may be different from those in the image display device 180.

The sensor element 118 includes a stacked-layer structure in which the conductive layer 176, the insulating layer 177, and the conductive layer 178 are stacked in this order over the insulating layer 175. Because the sensor element 118 overlaps a plurality of light-emitting elements 114, light-transmitting materials are used for the conductive layers 176 and 178. The conductive layers 176 and 178 can serve as a pair electrode and the insulating layer 177 can serve as a dielectric in the sensor element 118.

An insulating layer 179 is provided over the conductive layer 178. A color filter 127 and a black matrix 126 are provided over the insulating layer 179 so as to overlap with the light-emitting element 114 and the insulating layer 144, respectively.

[Materials and Formation Method]

Materials and methods for forming the components will be described.

<Flexible Substrate>

As the flexible substrate, an organic resin substrate, a glass substrate thin enough to have flexibility, or the like can be used.

Examples of the materials include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. It is also possible to use a substrate in which a fibrous body is impregnated with a resin (also referred to as prepreg) or a substrate whose thermal expansion coefficient is reduced by mixing an inorganic filler with an organic resin.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as a flexible substrate. The structure body including the fibrous body and the resin is preferably used as a flexible substrate, in which case the reliability against bending and damage due to local pressure can be increased.

A material capable of transmitting light emitted from the EL layer 151 is used for the flexible substrate through which light emitted from the light-emitting element 114 is transmitted. To improve the outcoupling efficiency of the material provided on the light extraction side, the refractive index of the flexible, light-transmitting material is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferably used, in which case such a filler can maintain optical transparency.

The substrate provided on the side opposite to the side through which light is transmitted does not need to have a light-transmitting property; therefore, a metal substrate, an alloy substrate, or the like can be used as well as the above substrates. To obtain flexibility and bendability, the thickness of a substrate is preferably greater than or equal to 10 μm and less than or equal to 200 μm, more preferably greater than or equal to 20 μm and less than or equal to 50 μm. Although there is no particular limitation on a material of the substrate, it is preferable to use, for example, aluminum, copper, nickel, or a metal alloy such as an aluminum alloy or stainless steel. A conductive substrate containing a metal or an alloy material is preferably used as the flexible substrate provided on the side through which light is not transmitted, in which case the dissipation of heat generated from the light-emitting element 114 can be improved.

In the case where a conductive substrate is used, a surface of the substrate is preferably oxidized or provided with an insulating film so as to be insulated. For example, an insulating film may be formed over the surface of the conductive substrate by an electrodeposition method, a coating method such as a spin-coating method or a dip method, a printing method such as a screen printing method, or a deposition method such as an evaporation method or a sputtering method. Alternatively, the surface of the substrate may be oxidized by being exposed to an oxygen atmosphere or heated in an oxygen atmosphere or by an anodic oxidation method.

In the case where the flexible substrate has an uneven surface, a planarization layer may be provided to cover the uneven surface so that a flat insulating surface is formed. An insulating material can be used for the planarization layer; an organic material or an inorganic material can be used. The planarization layer can be formed by a deposition method such as a sputtering method, a coating method such as a spin-coating method or a dip method, a discharging method such as an ink-jet method or a dispensing method, a printing method such as a screen printing method, or the like.

As the flexible substrate, a material including a plurality of stacked layers can also be used. For example, a material in which two or more kinds of layers formed of an organic resin are stacked, a material in which a layer formed of an organic resin and a layer formed of an inorganic material are stacked, or a material in which two or more kinds of layers formed of an inorganic material are stacked is used. With a layer formed of an inorganic material, moisture and the like are prevented from entering the inside, resulting in improved reliability of the touch panel.

As the inorganic material, an oxide material, a nitride material, or an oxynitride material of a metal or a semiconductor, or the like can be used. For example, silicon oxide, silicon nitride, silicon oxynitride, aluminum oxide, aluminum nitride, or aluminum oxynitride may be used. Note that in this specification, the nitride oxide refers to a material containing a larger amount of nitrogen than oxygen, and the oxynitride refers to a material containing a larger amount of oxygen than nitrogen. Note that the content of each element can be measured by, for example, Rutherford backscattering spectrometry (RBS).

For example, in the case where a layer formed of an organic resin and a layer formed of an inorganic material are stacked, the layer formed of an inorganic material can be formed over or under the layer formed of an organic resin by a sputtering method, a chemical vapor deposition (CVD) method, a coating method, or the like.

As the flexible substrate, a glass substrate thin enough to have flexibility may also be used. Specifically, it is preferable to use a sheet in which an organic resin layer, a bonding layer, and a glass layer are sequentially stacked from the side close to the light-emitting element 114. The thickness of the glass layer is greater than or equal to 20 μm and less than or equal to 200 μm, preferably greater than or equal to 25 μm and less than or equal to 100 μm. Such a thickness allows the glass layer to have both high flexibility and a high barrier property against water and oxygen. The thickness of the organic resin layer is greater than or equal to 10 μm and less than or equal to 200 μm, preferably greater than or equal to 20 μm and less than or equal to 50 μm. With such an organic resin layer in contact with the glass layer, breakage or a crack of the glass layer can be inhibited, resulting in increased mechanical strength. Forming the flexible substrate by using such a composite material of a glass material and an organic resin makes it possible to obtain a flexible touch panel with extremely high reliability.

Alternatively, a substrate which does not have flexibility, such as a glass substrate, may be used.

<Light-Emitting Element>

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element 114 included in the image display device 180 of this embodiment includes a pair of electrodes (the first electrode 143 and the second electrode 152), and the EL layer 151 between the pair of electrodes. One of the pair of electrodes functions as an anode and the other functions as a cathode.

In the light-emitting element 114, a material transmitting light emitted from the EL layer 151 is used for the electrode on the light emission side.

As the light-transmitting material, indium oxide, indium oxide-tin oxide, indium oxide-zinc oxide, zinc oxide, and zinc oxide to which gallium is added can be used. Graphene may also be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. In the case of using the metal material (or the nitride thereof), the thickness is set small enough to be able to transmit light. Alternatively, a stack including any of the above materials can also be used as the conductive layer. For example, a layered film of a silver-magnesium alloy and indium oxide-tin oxide is preferably used, in which case electrical conductivity can be increased.

Such an electrode is formed by an evaporation method, a sputtering method, or the like. A discharging method such as an ink-jet method, a printing method such as a screen printing method, or a plating method may also be used.

Note that when the above conductive oxide having a light-transmitting property is formed by a sputtering method, the deposition under an atmosphere containing argon and oxygen increases the light-transmitting property.

Further, in the case where the conductive oxide film is formed over the EL layer, the conductive oxide film is preferably a layered film of a first conductive oxide film formed under an argon-containing atmosphere with a reduced oxygen concentration and a second conductive oxide film formed under an atmosphere containing argon and oxygen, in which case deposition damage to the EL layer can be reduced. Here, the purity of an argon gas used for formation of the first conductive oxide film is preferably high, and for example, it is preferable to use the argon gas whose dew point is lower than or equal to −70° C., more preferably lower than or equal to −100° C.

A material capable of reflecting light emitted from the EL layer 151 is preferably used for the electrode provided on the side opposite to the side through which light is transmitted.

As the light-reflecting material, for example, a metal such as aluminum, gold, platinum, silver, nickel, tungsten, chromium, molybdenum, iron, cobalt, copper, or palladium or an alloy containing any of these metals can be used. Alternatively, lanthanum, neodymium, germanium, or the like may be added to a metal or an alloy containing any of these metal materials. In addition, any of the following can be used:

alloys containing aluminum (aluminum alloys) such as an aluminum-titanium alloy, an aluminum-nickel alloy, and an aluminum-neodymium alloy; and alloys containing silver such as a silver-copper alloy, a silver-palladium-copper alloy, and a silver-magnesium alloy. The silver-copper alloy is preferable because of its high heat resistance. Furthermore, by stacking a metal film or a metal oxide film in contact with an aluminum alloy film, oxidation of the aluminum alloy film can be suppressed. Examples of a material for the metal film or the metal oxide film are titanium and titanium oxide. Further alternatively, a film containing any of the above light-transmitting materials and a film containing any of the above metal materials may be stacked. For example, a layered film including silver and indium oxide-tin oxide, or a layered film including a silver-magnesium alloy and indium oxide-tin oxide can be used.

Such an electrode is formed by an evaporation method, a sputtering method, or the like. A discharging method such as an ink-jet method, a printing method such as a screen printing method, or a plating method may also be used.

The EL layer 151 includes at least a layer containing a light-emitting organic compound (hereinafter also referred to as a light-emitting layer), and may be either a single layer or a plurality of stacked layers. As an example of the structure including a plurality of stacked layers, a hole-injection layer, a hole-transport layer, a light-emitting layer, an electron-transport layer, and an electron-injection layer can be stacked in this order from an anode side. Note that not all of these layers except the light-emitting layer are necessarily provided in the EL layer 151. Furthermore, each of these layers may be provided in duplicate or more. Specifically, in the EL layer 151, a plurality of light-emitting layers may be provided or another hole-injection layer may be provided over the electron-injection layer. Furthermore, another component such as a charge-generation layer or an electron-relay layer may be added as appropriate as an intermediate layer. Alternatively, a plurality of light-emitting layers exhibiting different colors may be stacked. For example, a white emission can be obtained by stacking two or more layers emitting light of complementary colors.

The EL layer 151 can be formed by a vacuum evaporation method, a discharging method such as an ink-jet method or a dispensing method, or a coating method such as a spin-coating method.

<Sealing Layer and Bonding Layer>

As the sealing layer 153, it is possible to use, for example, a gel or a curable material such as a two-component-mixture type resin, a thermosetting resin, or a light curable resin. For example, an epoxy resin, an acrylic resin, a silicone resin, a phenol resin, polyimide, polyvinyl chloride (PVC), polyvinyl butyral (PVB), or ethylene vinyl acetate (EVA) can be used. In particular, a material with low moisture permeability, such as an epoxy resin, is preferable.

A drying agent may be contained in the sealing layer 153. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used as the drying agent. In the case where a granular drying agent is used, light emitted from the light-emitting element 114 is diffusely reflected by the drying agent; thus, a highly reliable light-emitting device (particularly useful for lighting and the like) with improved viewing angle dependence can be achieved. Note that as the bonding layers 125 and 131, the same material as the sealing layer 153 may be used.

<Transistor>

Structures of the transistors 112, 113, 119, 116, 117, and 129 are not particularly limited. For example, a forward staggered transistor, an inverted staggered transistor, or the like may be used. A top-gate transistor or a bottom-gate transistor may be used. A channel-etched transistor or a channel protective transistor may be used. In the case of a channel protective transistor, a channel protective film may be provided only over a channel region. Alternatively, an opening may be formed only in a portion where a source and drain electrodes are in contact with a semiconductor layer and a channel protective film may be provided in an area other than the opening.

As a semiconductor applicable to a semiconductor layer in which a channel of a transistor is formed, for example, a semiconductor material such as silicon or germanium, a compound semiconductor material, an organic semiconductor material, or an oxide semiconductor material may be used.

There is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

In the case where, for example, silicon is used as the semiconductor, amorphous silicon, microcrystalline silicon, polycrystalline silicon, single crystal silicon, or the like can be used.

In the case where an oxide semiconductor is used as the semiconductor, an oxide semiconductor containing at least one of indium, gallium, and zinc is preferably used. Typically, an In—Ga—Zn-based metal oxide can be used. An oxide semiconductor having a wider band gap and a lower carrier density than silicon is preferably used, in which case off-state leakage current can be reduced.

<Buffer Layer and Insulating Layer>

The buffer layer 120 has a function of inhibiting diffusion of impurities which have passed through the first substrate 121 and the bonding layer 125. The second buffer layer 132 has a function of inhibiting diffusion of impurities that have passed through the second substrate 101 and the bonding layer 131. The insulating layers 134 and 172 in contact with the semiconductor layer of the transistor and the insulating layers 141 and 175 covering the transistor preferably prevent impurities from diffusing into the semiconductor layer. These layers can be formed using, for example, oxide or nitride of a semiconductor such as silicon or oxide or nitride of a metal such as aluminum. Alternatively, a layered film of such an inorganic insulating material or a layered film of such an inorganic insulating material and an organic insulating material may be used.

As the inorganic insulating material, for example, a single layer of or a stack including one or more materials selected from aluminum nitride, aluminum oxide, aluminum nitride oxide, aluminum oxynitride, magnesium oxide, gallium oxide, silicon nitride, silicon oxide, silicon nitride oxide, silicon oxynitride, germanium oxide, zirconium oxide, lanthanum oxide, neodymium oxide, and tantalum oxide.

As the inorganic insulating material, a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide may be used.

The insulating layers 142 and 177 functions as a planarization layer covering steps formed due to a transistor, a wiring, or the like. For the insulating layer 142, for example, an organic resin such as polyimide, acrylic, polyamide, or epoxy or an inorganic insulating material can be used. It is preferable to use a photosensitive resin (e.g., acrylic or polyimide) for the insulating layer 142. For the insulating layer 177, a photosensitive resin or the materials similar to those of the insulating layers (e.g., the insulating layer 134) can be used. Also, the insulating layers 144 and 179 can be formed using the same material as the insulating layer 142.

<Crack Inhibiting Layer>

The crack inhibiting layer 122 can be formed using a conductive material.

The crack inhibiting layer 122 is preferably formed using the same material as the gate electrode 171 of the transistor 116 and the like to simplify the process.

The crack inhibiting layer 122 is preferably formed of a conductive material that is highly resistant to external stress so as to hinder the development of a crack in the buffer layer 120 in contact with the crack inhibiting layer 122.

The clack inhibiting layer 122 can be formed to have a single-layer structure or a layered structure using any of metal materials such as molybdenum, titanium, chromium, tantalum, tungsten, aluminum, copper, neodymium, and scandium, and an alloy material containing any of these elements. Alternatively, the clack inhibiting layer 122 may be formed using a conductive metal oxide.

A resin material having high adhesion to the buffer layer 120 such as polyimide, acrylic, polyamide, and epoxy may be used for the crack inhibiting layer 122.

The crack inhibiting layer 122 needs to have a thickness that allows the mechanical strength to be maintained. Specifically, the crack inhibiting layer 122 is formed as a conductive layer with a thickness of 50 nm to 1000 nm, preferably 100 nm to 500 nm.

In addition, the crack inhibiting layer 122 needs to have a width that allows the development of a crack to be hindered. However, an increase in the width of the crack inhibiting layer 122 might reduce the number of touch panels that can be obtained from a substrate in the case where the touch panel 100 is manufactured by a multiple panel method or the like. Specifically, the crack inhibiting layer 122 is formed as a conductive layer with a width of 20 µm to 1000 µm, preferably 50 µm to 500 µm.

<Conductive Layer>

A light-transmitting material is used for the conductive layers 176 and 178 serving as a pair of electrodes in the sensor element 118.

As the light-transmitting material, indium oxide, indium oxide-tin oxide, indium oxide-zinc oxide, zinc oxide, and zinc oxide to which gallium is added can be used. Graphene may be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. Note that when a metal material (or a nitride thereof) is used, its thickness is reduced so that light-transmitting property can be obtained. Alternatively, a stack of any of the materials can be used as the conductive layer. For example, a stacked film of a silver-magnesium alloy and indium oxide-tin oxide is preferably used, in which case electrical conductivity can be increased.

The conductive layers 176 and 178 are formed by an evaporation method, a sputtering method, or the like. A discharging method such as an ink-jet method, a printing method such as a screen printing method, or a plating method may be used.

Note that when the above conductive oxide having a light-transmitting property is formed by a sputtering method, the deposition under an atmosphere containing argon and oxygen increases the light-transmitting property.

An oxide conductor may be used for one of the conductive layers, which will be described in Modification Example.

<Connector>

For the connector 156, it is possible to use a paste-like or sheet-like material that is obtained by mixing metal particles into a thermosetting resin and for which anisotropic electric conductivity is provided by thermocompression bonding. As the metal particles, particles in which two or more kinds of metals are layered, for example, nickel particles coated with gold are preferably used.

<Color Filter and Black Matrix>

The color filter 127 is provided in order to adjust the color of light emitted from the light-emitting element 114 to increase the color purity. For example, in the full-color display device 180 using white light-emitting elements, a plurality of pixels provided with color filters of different colors are used. In that case, the color filters may be those of three colors of red (R), green (G), and blue (B) or four colors (yellow (Y) in addition to these three colors). Furthermore, a white (W) pixel may be added to R, G, and B pixels (and a Y pixel), that is, pixels of four colors (or five colors) may be used.

The black matrix 126 is provided between the adjacent color filters 127. The black matrix 126 shields a pixel from light emitted from the light-emitting element 114 in an adjacent pixel, thereby preventing color mixture between the adjacent pixels. When the color filter 127 is provided so that its end portion overlaps with the black matrix 126, light leakage can be reduced. The black matrix 126 can be formed using a material that blocks light emitted from the light-emitting element 114, for example, a metal material or an organic resin containing a pigment. Note that the black matrix 126 may be provided in a region other than the display portion 102, for example, in the scan line driver circuit 104.

An overcoat may be formed to cover the color filter 127 and the black matrix 126. The overcoat protects the color filter 127 and the black matrix 126 and suppresses the diffusion of impurities included in the color filter 127 and the black matrix 126. The overcoat is formed using a material that transmits light emitted from the light-emitting element 114, and can be formed using an inorganic insulating film or an organic insulating film.

Described in Embodiment 1 is a structure provided with a color filter, but a structure without using a color filter may be employed in which each pixel includes any one of light-emitting elements exhibiting light of different colors (e.g., R, G, and B).

The above is the description of the components.

[Example of Manufacturing Method]

An example of a method of manufacturing the touch panel 100 is described with reference to drawings.

FIGS. 3A to 3C, FIGS. 4A and 4B, FIGS. 5A and 5B, FIG. 6, FIG. 7 and FIG. 8 are schematic cross-sectional views each illustrating the method for manufacturing the touch panel 100 described below. FIGS. 3A to 3C, FIGS. 4A and 4B, FIGS. 5A and 5B, FIG. 6, FIG. 7, and FIG. 8 correspond to the cross-sectional structures of the components shown in FIG. 1 and FIG. 2.

<Formation of Separation Layer>

First, a separation layer 162 is formed over a support substrate 161.

A substrate having resistance high enough to withstand at least heat in a later step is used as the support substrate 161. Examples of the support substrate 161 include a glass substrate, a resin substrate, a semiconductor substrate, a metal substrate, and a ceramic substrate.

Note that it is preferable to use a large glass substrate as the support substrate 161 to increase productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

A high-melting-point metal material such as tungsten, titanium, or molybdenum can be used for the separation layer 162. Tungsten is preferably used.

The separation layer 162 can be formed by, for example, a sputtering method.

<Formation of Buffer Layer>

Then, the buffer layer 120 is formed over the separation layer 162 (FIG. 3A).

For the buffer layer 120, an inorganic insulating material such as silicon oxide, silicon oxynitride, silicon nitride oxide, silicon nitride, or aluminum oxide can be used. The buffer layer 120 can be a single layer or stacked layers containing any of these inorganic insulating materials.

The buffer layer 120 serves as a barrier film preventing entry of impurities from the outside of the support substrate 161. The buffer layer 120 also has a function of releasing hydrogen to the separation layer 162 by heating as described later. Therefore, it is particularly preferable that the buffer layer 120 include two or more stacked layers, at least one of which releases hydrogen when heated, and another of which, a layer further from the separation layer 162 than the layer releasing hydrogen is, does not transmit impurities. For example, the buffer layer 120 has a structure in which a layer containing silicon oxynitride and a layer containing silicon nitride are stacked in this order from the separation layer 162.

The buffer layer 120 can be formed by a film formation method such as a sputtering method or a plasma CVD method. In particular, the buffer layer 120 is preferably formed by a plasma CVD method using a deposition gas containing hydrogen.

A surface of the separation layer 162 is oxidized when the buffer layer 120 is formed, and as a result, an oxide (not shown) is formed between the separation layer 162 and the buffer layer 120. The oxide is a layer containing an oxide of the metal included in the separation layer 162. The oxide layer preferably contains tungsten oxide.

Tungsten oxide is generally represented by $WO_{(3-x)}$ and is a non-stoichiometric compound which can have a variety of compositions, typically $WO_3$, $W_2O_5$, $W_4O_{11}$, and $WO_2$. Titanium oxide $TiO_{(2-x)}$ and molybdenum oxide $MoO_{(3-x)}$ are also non-stoichiometric compounds.

The oxide layer at this stage preferably contains a large amount of oxygen. For example, in the case where tungsten is used for the separation layer 162, the oxide layer is preferably a tungsten oxide layer containing $WO_3$ as its main component.

The oxide layer can also be formed over the surface of separation layer 162 in advance by performing plasma treatment on the surface of the separation layer 162 in an atmosphere containing an oxidized gas (preferably a dinitrogen monoxide gas) before the formation of the buffer layer 120. When such a method is employed, the thickness of the oxide layer can vary depending on the conditions for the plasma treatment, and the thickness of the oxide layer can be controlled more effectively than in the case where plasma treatment is not performed.

The thickness of the oxide layer is, for example, greater than or equal to 0.1 nm and less than or equal to 100 nm, preferably greater than or equal to 0.5 nm and less than or equal to 20 nm. Note that the oxide layer with an extremely small thickness cannot be observed in a cross-sectional image in some cases.

<Heat Treatment>

Next, heat treatment is performed to change the quality of the oxide layer. By the heat treatment, hydrogen is released from the buffer layer 120 to the oxide layer.

The metal oxide in the oxide layer is reduced by hydrogen supplied to the oxide layer, so that a plurality of regions with different proportions of oxygen are mixed in the oxide layer. For example, in the case where tungsten is used for the separation layer 162, $WO_3$ in the oxide layer is reduced to generate an oxide with a proportion of oxygen lower than that of $WO_3$ (e.g., $WO_2$), resulting in a state where $WO_3$ and the oxide with the lower proportion of oxygen are mixed. The crystal structure of such a metal oxide depends on the proportion of oxygen; thus, when a plurality of regions with different proportions of oxygen are provided in the oxide layer, the mechanical strength of the oxide layer is reduced. As a result, the oxide layer is likely to be damaged inside, which facilitates a later separation step.

The heat treatment may be performed at a temperature higher than or equal to the temperature at which hydrogen is released from the buffer layer 120 and lower than or equal to the temperature at which the support substrate 161 is softened. Furthermore, the heat treatment is preferably performed at a temperature higher than or equal to the temperature at which a reduction reaction between hydrogen and the metal oxide in the oxide layer occurs. For example, in the case where tungsten is used for the separation layer 162, the heating temperature is higher than or equal to 420° C., higher than or equal to 450° C., higher than or equal to 600° C., or higher than or equal to 650° C.

As the temperature of the heat treatment increases, a larger amount of hydrogen can be released from the buffer layer 120, which facilitates a later separation step. However, even when the heating temperature is reduced in consideration of the heat resistance of the support substrate 161 and the productivity, separation can be performed effectively by performing plasma treatment on the separation layer 162 to form the oxide layer in advance as described above.

<Formation of Gate Electrode and Crack Inhibiting Layer>

A conductive film is deposited on the buffer layer 120. A resist mask is formed on the conductive film by a photolithography process or the like and unnecessary portions of the conductive film are etched. The resist mask is then removed, so that the gate electrode 171 and the crack inhibiting region 110 including a plurality of crack inhibiting layers 122 are formed.

Note that wirings and the like included in the circuit may be formed simultaneously.

The conductive film to be the gate electrode 171 is deposited by a sputtering method, an evaporation method, a CVD method, or the like.

Note that the crack inhibiting layers 122 and the gate electrode 171 may be formed separately and use different materials.

<Formation of Gate Insulating Layer>

The insulating layer 172 covering the gate electrode 171 is formed. Here, openings reaching a wiring to be the external connection terminal 109 and a portion of the wiring being connected to one of the pair of electrodes 174 of the transistor 129 for the scan line driver circuit are formed in the insulating layer 172 (see FIG. 3B).

The insulating layer 172 can be formed by a plasma CVD method, a sputtering method, and the like.

Note that this manufacturing method shows an example in which the insulating layer 172 over the semiconductor layer 173 is a single layer, but the insulating layer 172 may include two or more stacked layers.

<Formation of Semiconductor Layer>

After that, a semiconductor layer is formed over the insulating layer 172. A resist mask is formed over the semiconductor film by a photolithography process or the like and unnecessary portions of the semiconductor film are etched. Then, the resist mask is removed, so that the semiconductor layer 173 included in a transistor is formed.

The semiconductor film is formed by an appropriate method depending on a material. For example, a sputtering method, a CVD method, an MBE method, an atomic layer deposition (ALD) method, or a pulsed laser deposition (PLD) method can be used.

An oxide semiconductor is preferably used as a semiconductor in the semiconductor layer. In particular, an oxide semiconductor having a wider band gap than silicon is preferably used. A semiconductor material having a wider band gap and a lower carrier density than silicon is preferably used because the off-state current of the transistor can be reduced.

The oxide semiconductor preferably contains, for example, at least indium (In) or zinc (Zn). The oxide semiconductor further preferably contains an In—M—Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film that is caused by stress when a display panel is bent is prevented. Such an oxide semiconductor can thus be preferably used for a flexible display panel that is used in a bent state, or the like.

In the case where polycrystalline silicon is used for the semiconductor film, a film of amorphous silicon is deposited and subjected to crystallization (e.g., laser light irradiation or heat treatment) to form a semiconductor film including polycrystalline silicon.

<Source Electrode and Drain Electrode>

After that, a conductive film is formed over the insulating layer 172 and the semiconductor layer 173. A resist mask is then formed over the conductive film by a photolithography method or the like, and unnecessary portions of the conductive film are etched. Then, the resist mask is removed, so that the electrodes 174 serving as a source and a drain electrode of the transistor are formed.

At this time, wirings and the like which form a circuit may be formed simultaneously. In this example of the manufacturing method, the conductive film is formed over the same conductive film as the gate electrode 171 in a portion to be an external connection terminal.

The conductive film is formed by a sputtering method, an evaporation method, a CVD method, or the like.

At this stage, the transistors 116, 117, and 129 are obtained.

<Formation of Insulating Layer>

Subsequently, the insulating layer 175 that covers the insulating layer 172, the semiconductor layer 173, and the electrode 174 is formed. At this time, an opening reaching one of the electrodes 174 of the transistor 113 and a wiring to be the external connection terminal is formed in the insulating layer 175 (see FIG. 3C).

The insulating layer 175 can be formed by a plasma CVD method, a sputtering method, or the like.

Note that this manufacturing method shows an example in which the insulating layer 175 over the insulating layer 172, the semiconductor layer 173, and the electrode 174 is a single layer, but the insulating layer 175 may include two or more stacked layers.

<Formation of Electrode and Insulating Layer>

A conductive film is formed on the insulating layer 175. A resist mask is formed on the conductive film by a photolithography process or the like and unnecessary portions of the conductive film are etched. The resist mask is then removed, so that the conductive layer 176 functioning as one electrode of the sensor element 118 is formed.

At this time, wirings and the like which form a circuit may be formed simultaneously. In this example of manufacturing method, the conductive film is formed over the same conductive film as the electrode 174 in a portion serving as the external connection terminal, so that the external connection terminal 109 is formed.

The conductive film is formed by a sputtering method, an evaporation method, a CVD method, or the like.

Next, the insulating layer 177 is formed over the insulating layer 175 and the conductive layer 176. At this time, an opening reaching the external connection terminal 109 is formed in the insulating layer 177.

An opening reaching the insulating layer 175 and surrounding a region to be the sensor portion 106 may be formed in the insulating layer 177. In the case where an organic resin is used for the insulating layer 177, entry of moisture from outside through the insulating layer 177 can be inhibited owing to the opening surrounding the region to be the sensor portion 106. In this example of a manufacturing method, the opening surrounding the region to be the sensor portion 106 is formed between the end portion of the support substrate 161 and a region to be the scan line driver circuit 107 and between the end portion of the support substrate 161 and the converter 108.

The insulating layer 177 can be formed by a plasma CVD method, a sputtering method, and the like. The insulating layer 177 can be formed by a printing method, an ink-jet method, a photolithography method, or the like.

Note that this manufacturing method shows an example in which the insulating layer 177 over the conductive layer 176 is a single layer, but the insulating layer 177 may include two or more stacked layers.

Next, a conductive film is formed over the insulating layer 177. A resist mask is formed over the conductive film by a photolithography process or the like and unnecessary portions of the conductive film are etched. The resist mask is then removed, so that the conductive layer 178 functioning as one electrode of the sensor element 118 is formed.

The conductive film is formed by a sputtering method, an evaporation method, a CVD method, or the like.

The sensor element 118 is formed at this stage (see FIG. 4A).

Next, the insulating layer 179 is formed over the insulating layer 177 and the conductive layer 178. An opening reaching the external connection terminal 109 is formed in the insulating layer 179.

An opening reaching the insulating layer 175 and surrounding a region to be the sensor portion 106 may be formed in the insulating layer 179. In this example of a manufacturing method, the opening surrounding the region to be the sensor portion 106 is formed between the end portion of the support substrate 161 and a region to be the scan line driver circuit 107 and between the end portion of the support substrate 161 and the converter 108.

The insulating layer 179 can be formed by a plasma CVD method, a sputtering method, or the like. The insulating layer 179 can be formed by a printing method, an ink-jet method, a photolithography method, or the like.

Note that this manufacturing method shows an example in which the insulating layer 179 over the conductive layer 178 is a single layer, but the insulating layer 179 may include two or more stacked layers.

<Formation of Black Matrix and Color Filter>

Subsequently, the black matrix 126 and the color filter 127 are formed over the insulating layer 179 (see FIG. 4B). The black matrix 126 and the color filter 127 are formed by a printing method, an ink-jet method, a photolithography method, or the like.

<Formation of Gate Electrode>

Next, a support substrate 163 provided with the separation layer 164 and the second buffer layer 132 is prepared. The separation layer 164 and the second buffer layer 132 are formed in a manner similar to that of the separation layer 162 and the buffer layer 120.

After that, a conductive film is formed over the second buffer layer 132. A resist mask is formed over the conductive film by a photolithography process or the like and unnecessary portions of the conductive film are etched. Then, the resist mask is removed, so that the gate electrode 133 is formed.

At this time, wirings and the like which form a circuit may be formed simultaneously.

The conductive film to be the gate electrode 133 is formed by a sputtering method, an evaporation method, a CVD method, or the like.

<Formation of Gate Insulating Layer>

Then, the insulating layer 134 is formed to cover the gate electrode 133.

Note that an opening reaching the wiring included in the circuit and formed using the same conductive film for the gate electrode 133 may be formed at this stage.

The insulating layer 134 can be formed by a plasma CVD method, a sputtering method, or the like.

<Formation of Semiconductor Layer>

After that, a semiconductor film is formed over the insulating layer 134. A resist mask is then formed over the semiconductor film by a photolithography method or the like, and unnecessary portions of the semiconductor film are etched. Then, the resist mask is removed, so that the semiconductor layer 135 included in a transistor is formed.

The semiconductor film is formed by an appropriate method depending on a material. For example, a sputtering method, a CVD method, an MBE method, an atomic layer deposition (ALD) method, or a pulsed laser deposition (PLD) method can be used.

An oxide semiconductor is preferably used as a semiconductor in the semiconductor layer. In particular, an oxide semiconductor having a wider band gap than silicon is preferably used. A semiconductor material having a wider band gap and a lower carrier density than silicon is preferably used because the off-state current of the transistor can be reduced.

The oxide semiconductor preferably contains, for example, at least indium (In) or zinc (Zn). The oxide semiconductor further preferably contains an In—M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film that is caused by stress when a display panel is bent is prevented. Such an oxide semiconductor can thus be preferably used for a flexible display panel that is used in a bent state, or the like.

In the case where polycrystalline silicon is used for the semiconductor film, a film of amorphous silicon is deposited and subjected to crystallization (e.g., laser light irradiation or heat treatment) to form a semiconductor film including polycrystalline silicon.

<Source Electrode and Drain Electrode>

After that, a conductive film is formed over the insulating layer 134 and the semiconductor layer 135. A resist mask is then formed over the conductive film by a photolithography method or the like, and unnecessary portions of the conductive film are etched. Then, the resist mask is removed, so that the electrodes 136 serving as a source and a drain electrode of the transistor are formed (FIG. 4A).

At this time, wirings and the like which form a circuit may be formed simultaneously.

The conductive film is formed by a sputtering method, an evaporation method, a CVD method, or the like.

At this stage, the transistors 112, 113, 119 are obtained (see FIG. 5A).

<Formation of Insulating Layer>

Subsequently, the insulating layer 141 that covers the insulating layer 134, the semiconductor layer 135, and the electrode 136 is formed. At this time, an opening reaching one of the electrodes 136 of the current control transistor 112 and a wiring to be the external connection terminal 105 is formed in the insulating layer 141.

The insulating layer 141 can be formed by a plasma CVD method, a sputtering method, or the like.

Note that this manufacturing method shows an example in which the insulating layer 141 over the insulating layer 134, the semiconductor layer 135, and the electrode 136 is a single layer, but the insulating layer 141 may include two or more stacked layers.

<Formation of Planarization Layer>

Then, the insulating layer 142 serving as a planarization layer is formed. At this time, an opening reaching one of the electrodes 136 of the current control transistor 112 and a wiring to be the external connection terminal 105 is formed in the insulating layer 142.

An opening reaching the insulating layer 141 and surrounding a region to be the display portion 102 may be formed in the insulating layer 142. In the case where an organic resin is used for the insulating layer 142, entry of moisture from outside through the insulating layer 142 can be inhibited owing to the opening surrounding the region to be the display portion 102. In this example of a manufacturing method, the opening surrounding the display portion 102 is formed between the end portion of the substrate 101 and the scan line driver circuit 104.

For example, the insulating layer 142 is preferably formed in such a manner that a photosensitive organic resin is applied by a spin coating method or the like, and then is subjected to selective light exposure and development. As another formation method, a sputtering method, an evaporation method, a droplet discharging method (e.g., an inkjet method), a printing method (e.g., a screen printing method or an offset printing method), or the like may be used.

<Formation of First Electrode>

After that, a conductive film is formed over the insulating layer 142. A resist mask is formed over the conductive film by a photolithography process or the like and unnecessary portions of the conductive film are etched. Then, the resist mask is removed, so that the first electrode 143 electrically connected to one of the electrodes 136 of the transistor 112 is formed.

At this time, wirings and the like which form a circuit may be formed simultaneously. In this example of manufacturing method, a wiring is formed over the same conductive film as the electrode 136 in a portion serving as the external connection terminal, so that the external connection terminal 105 is formed.

The conductive film is formed by a sputtering method, an evaporation method, a CVD method, or the like.

<Formation of Insulating Layer>

Then, the insulating layer 144 is formed to cover an end portion of the first electrode 143. At this time, an opening reaching the wiring serving as the external connection terminal 105 is formed in the insulating layer 144.

An opening reaching the insulating layer 141 and surrounding a region to be the display portion 102 may be formed in the insulating layer 144. In this example of a manufacturing method, the opening surrounding the display portion 102 is formed between the end portion of the substrate 101 and the scan line driver circuit 104.

The insulating layer 144 is preferably formed in such a manner that a photosensitive organic resin is applied by a spin coating method or the like, and then is subjected to selective light exposure and development. As another formation method, a sputtering method, an evaporation method, a droplet discharging method (e.g., an inkjet method), a printing method (e.g., a screen printing method or an offset printing method), or the like may be used.

Note that an insulating layer may be provided over the insulating layer 144. In FIG. 2, the insulating layer over the insulating layer 144 in the display portion 102 adjusts the distance between the first substrate 121 and the second substrate 101. The insulating layer can be formed using the same material as the insulating layer 144.

<Formation of Light-Emitting Element>

The EL layer 151 and the second electrode 152 are sequentially formed over the first electrode 143; thus the light-emitting element 114 is obtained (see FIG. 5B).

The EL layer 151 can be formed by a vacuum evaporation method, a discharging method such as an ink-jet method or a dispensing method, or a coating method such as a spin-coating method. The second electrode 152 is formed by an evaporation method, a sputtering method, or the like.

<Bonding>

Next, the sealing layer 153 is formed over the support substrate 161 on the sensor element 118 side or the support substrate 163 on the light-emitting element 114 side.

A curable resin is applied by, for example, a discharging method such as a dispensing method or a printing method such as a screen printing method, and a solvent in the resin is vaporized; thus, the sealing layer 153 is formed.

A bonding layer 154 surrounding the sensor portion 106 or the display portion 102 may be formed over the support substrate 161 or 163. The bonding layer 154 can increase the sealing function of the sealing layer 153. The bonding layer 154 can be formed by a similar method of the sealing layer 153.

Figure 6:
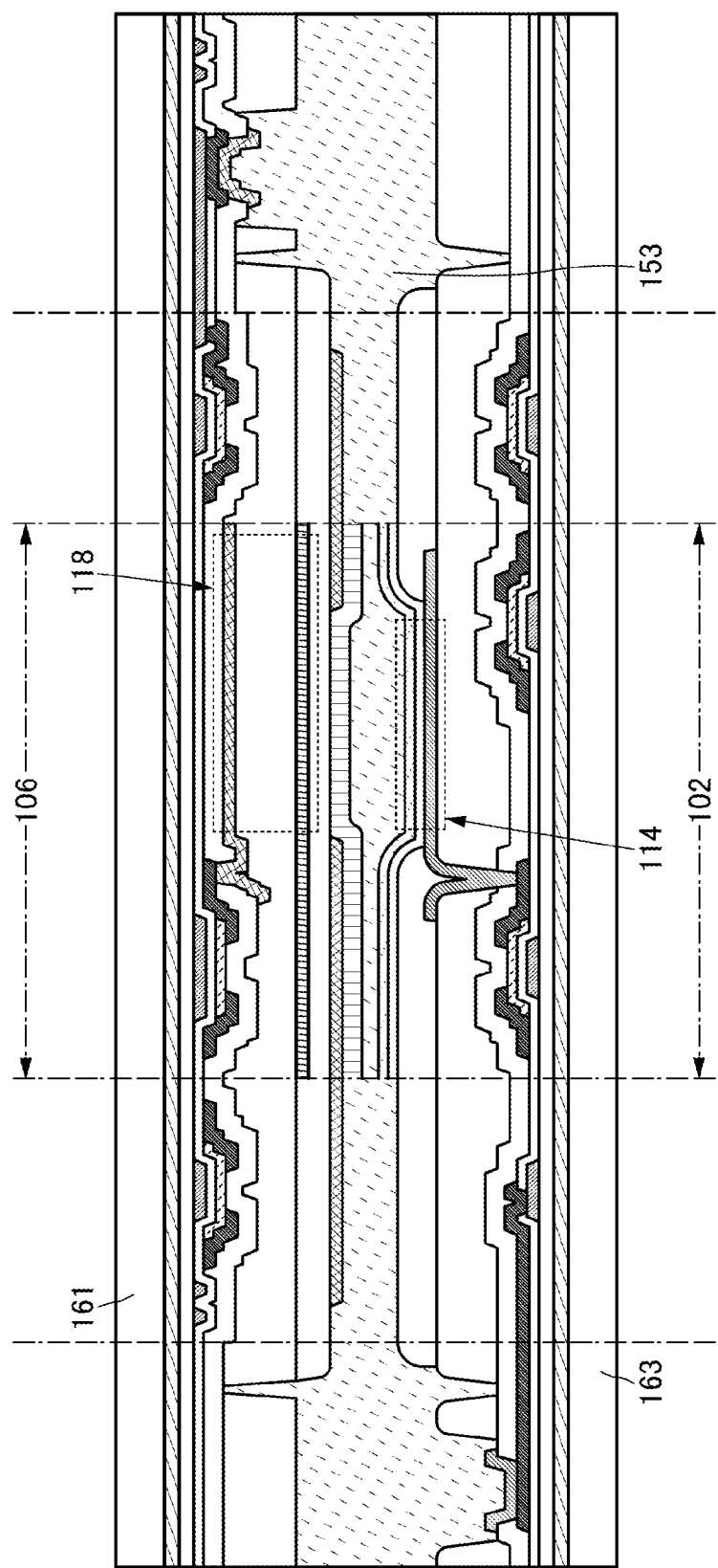
FIG. 6 illustrates a manufacturing method of an input/output device according to one embodiment.

Subsequently, the support substrate 161 and the support substrate 163 are bonded and the sealing layer 153 are cured, whereby the support substrate 161 and the support substrate 163 are attached to each other (see FIG. 6).

<Separation>

Figure 7:
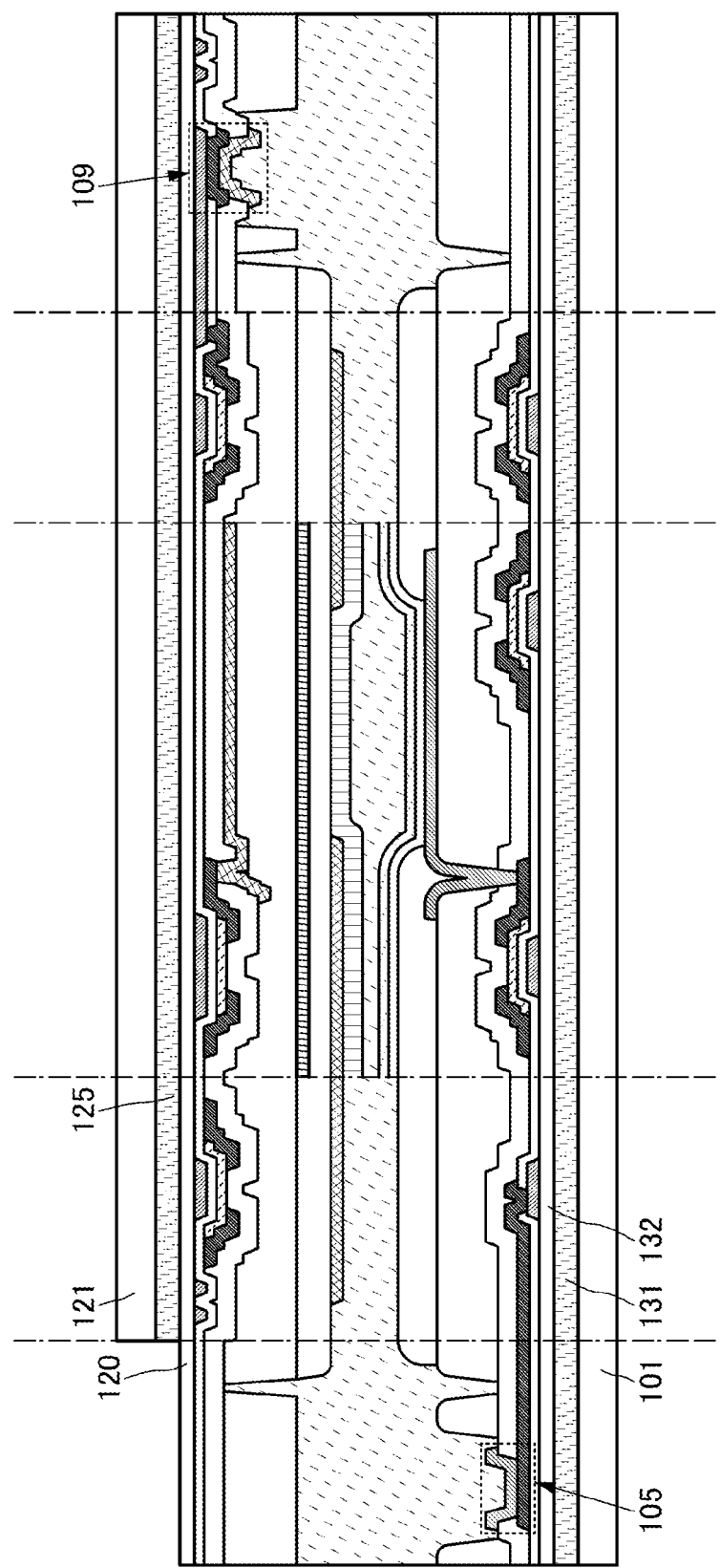
FIG. 7 illustrates a manufacturing method of an input/output device according to one embodiment.

The support substrate 163 is separated, and the exposed second buffer layer 132 is bonded to the second substrate 101 with the bonding layer 131 therebetween. The support substrate 161 is separated (see FIG. 7), and the exposed buffer layer 120 is bonded to the first substrate 121 with the bonding layer 125 therebetween. FIG. 7 shows a structure in which the second substrate 101 overlaps with the external connection terminal 109; however, the second substrate 101 does not necessarily overlap with the external connection terminal 109. FIG. 7 shows a structure in which the first substrate 121 does not overlap with the external connection terminal 105; however, the first substrate 121 may overlap with the external connection terminal 105.

For the separation, for example, the support substrate 161 is fixed to a suction stage and a separation starting point is formed between the separation layer 164 and the second buffer layer 132. The peeling starting point may be formed by, for example, inserting a sharp instrument such as a knife between the layers. Alternatively, the separation starting point may be formed by irradiating a region of the separation layer 164 with laser light to melt, evaporate, or thermally break the region. The separation starting point may be formed by dripping liquid (e.g., alcohol, water, or water containing carbon dioxide) onto an end portion of the separation layer 164 so that the liquid penetrates into an interface between the separation layer 164 and the second buffer layer 132 by using capillary action.

Then, physical force is gently applied to the area where the separation starting point is formed in a direction substantially perpendicular to the bonded surfaces, so that separation can be performed without damage to the buffer layer 132 and layers provided thereover.

A method for separating the support substrate 161 will be described. For example, another support substrate is bonded to the substrate 101 with a removable bonding layer (e.g., a water-soluble adhesive or a low-viscosity adhesive) therebetween. Then, a separation starting point may be formed between the separation layer 162 and the buffer layer 120 while the other support substrate is fixed similarly to the above. Alternatively, the substrate 101 is fixed to a suction pad while the support substrate 161 is fixed; then, a separation starting point is formed between the separation layer 162 and the buffer layer 120. After that, the suction pad is gently raised up so that the substrate and the like are not bent.

It is preferable that a separation starting point be formed in an end portion of the support substrate 161 so that the separation proceeds from the end portion. In the formation of the separation starting point, a crack occurs in some cases in the buffer layer 120 near the end portion of the support substrate 161. The crack formed at this time might develop from the outer side to the inner side of the buffer layer 120 as the separation proceeds. However, even when such a crack occurs, development of the crack can be stopped in a region where the crack inhibiting region 110 is provided because the sensor portion 106 is surrounded by the crack inhibiting region 110; thus, the crack can be effectively prevented from reaching the sensor portion 106.

Finally, an opening is formed in the buffer layer 120, the insulating layers 172, 175, and 177, and the sealing layer 153 to expose the external connection terminal 105.

Figure 8:
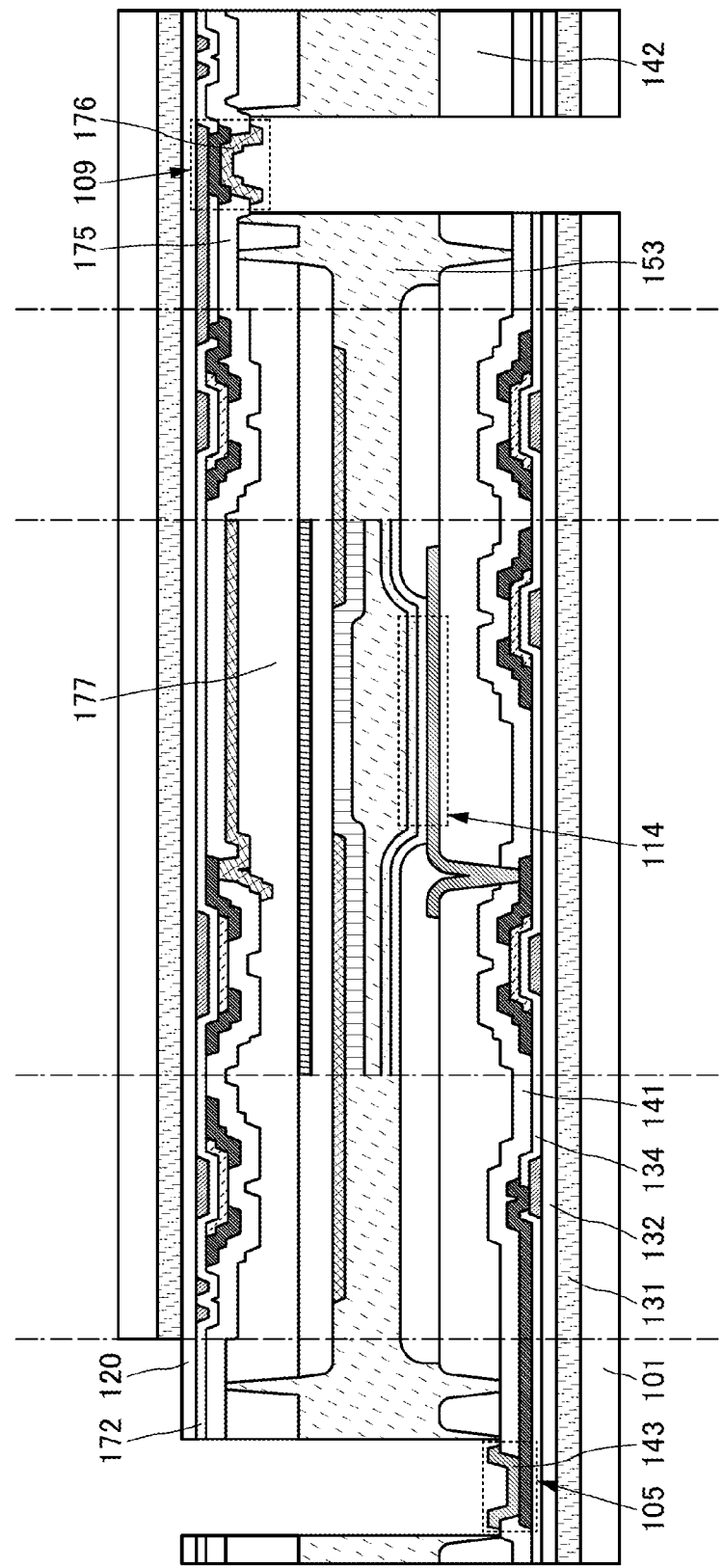
FIG. 8 illustrates a manufacturing method of an input/output device according to one embodiment.

An opening is also formed in the second substrate 101, the bonding layer 131, the buffer layer 132, the insulating layers 134, 141, and 142, and the sealing layer 153 to expose the external connection terminal 109 (see FIG. 8). The method for forming the opening is not particularly limited and may be, for example, a laser ablation method, an etching method, and an ion beam sputtering method. As another method, a cut may be made in a film over the external connection terminal 105 and/or the external connection terminal 109 with a sharp knife or the like and part of the film may be separated by physical force. In that case, an opening can be formed without damage to the external connection terminal 105 when a film (such as an EL layer) with a low adhesion to a conductive film is provided over the electrode 143, which is the outermost surface of the external connection terminal 105 and/or the electrode 176, which is the outermost surface of the external connection terminal 109.

Through the above process, the display device 100 can be manufactured.

Note that any of a variety of methods can be used as appropriate for the aforementioned separation process. For example, when a layer including a metal oxide film is formed as the separation layer on the side in contact with the buffer layer, the metal oxide film is embrittled by crystallization, whereby the buffer layer can be separated from the support substrate. Alternatively, when an amorphous silicon film containing hydrogen is formed as the separation layer between a support substrate having high heat resistance and a buffer layer, the amorphous silicon film is removed by laser light irradiation or etching, whereby the buffer layer can be separated from the support substrate. Alternatively, after a layer including a metal oxide film is formed as the separation layer on the side in contact with the buffer layer, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Further alternatively, the following method may be employed: a film containing nitrogen, oxygen, hydrogen, or the like (e.g., an amorphous silicon film containing hydrogen, an alloy film containing hydrogen, or an alloy film containing oxygen) is used as the separation layer, and the separation layer is irradiated with laser light to release the nitrogen, oxygen, or hydrogen contained in the separation layer as gas, thereby promoting separation between the buffer layer and the support substrate. Alternatively, it is possible to use a method in which the support substrate provided with the buffer layer is removed mechanically or by etching using a solution or a fluoride gas such as $NF_3$, $BrF_3$, or $ClF_3$. In this case, the separation layer is not necessarily provided.

When a plurality of the above-described separation methods are combined, the separation process can be conducted easily. In other words, separation can be performed with physical force (by a machine or the like) after performing laser light irradiation, etching on the separation layer with a gas, a solution, or the like, or mechanical removal with a sharp knife, scalpel or the like so that the separation layer and the buffer layer can be easily separated from each other.

Separation of the buffer layer from the support substrate may be performed by soaking the interface between the separation layer and the buffer layer in a liquid. Furthermore, the separation may be performed while a liquid such as water is being poured.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at the interface between the support substrate and the buffer layer is possible.

For example, glass is used as the support substrate, an organic resin such as polyimide is formed in contact with the glass, and an insulating film, a transistor, and the like are formed over the organic resin. In this case, heating the organic resin enables the separation at the interface between the support substrate and the organic resin.

Alternatively, separation at the interface between a metal layer and the organic resin may be performed in the following manner: the metal layer is provided between the support substrate and the organic resin and current is made to flow in the metal layer so that the metal layer is heated.

Through the above process, an input/output device with fewer defects caused by a crack can be provided.

[Modification Example of Touch Panel]

Modification examples of the touch panel 100 will be described.

Modification Example 1

Figure 9:
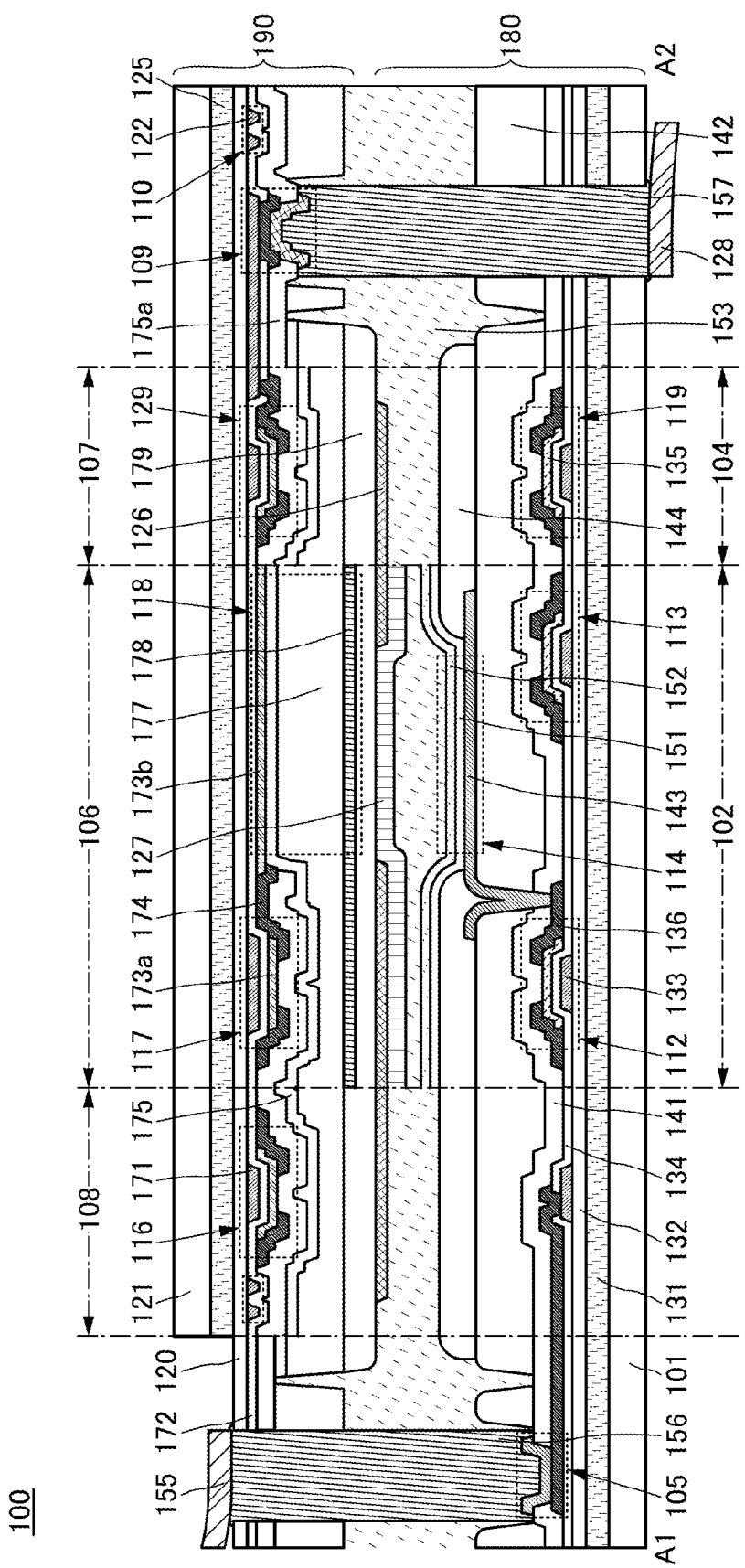
FIG. 9 illustrates a structure example of an input/output device of one embodiment.

FIG. 9 is a cross-sectional schematic view of the touch panel 100 of one embodiment of the present invention in which one electrode of the sensor element 118 is formed in the same process as a semiconductor layer. The main differences of FIG. 9 from FIG. 2 are that two layers, an oxide semiconductor layer 173a and an oxide conductor layer 173b, are formed using an oxide semiconductor and that an insulating layer 175a is formed. The oxide semiconductor layer 173a includes a region functioning as a channel in the transistor in the input device 190. The oxide conductor layer 173b functions as one electrode of the sensor element 118. The differences from FIG. 2 will be described.

Note that in this specification and the like, the oxide conductor layer can also be referred to as an oxide semiconductor layer having a high carrier density and a low resistance, an oxide semiconductor layer having conductivity, an oxide semiconductor layer having high conductivity, or the like.

An oxide semiconductor layer has a high light-transmitting property. By increasing oxygen vacancies and/or impurities such as hydrogen or water in the oxide semiconductor layer, an oxide semiconductor layer having a high carrier density and a low resistance can be obtained. Such an oxide semiconductor layer can be favorably used as an electrode of the sensor element 118 of the touch sensor 100.

It is preferable that the semiconductor layer of the transistor and the electrode of the sensor element be formed in the same step because the touch panel 100 can be manufactured in a small number of steps.

The oxide semiconductor layer 173a and the oxide conductor layer 173b are layers processed into island-like shapes through the same film formation step and the same etching step. An oxide semiconductor is a semiconductor material whose resistance can be controlled by oxygen vacancies in the film of the semiconductor material and/or the concentration of impurities such as hydrogen or water in the film of the semiconductor material. Therefore, to control the resistivity of each of the oxide semiconductor layer 173a and the oxide conductor layer 173b formed in the same step, treatment to be performed on the oxide semiconductor layers processed into island-like shapes is selected from the following: treatment for increasing oxygen vacancies and/or impurity concentration and treatment for reducing oxygen vacancies and/or impurity concentration.

Specifically, plasma treatment is performed on the island-like oxide semiconductor layer that is to be the oxide conductor layer 173b functioning as the electrode of the sensor element to increase oxygen vacancies and/or impurities such as hydrogen or water in the oxide semiconductor layer, so that the oxide semiconductor layer can have a high carrier density and a low resistance. Alternatively, an insulating film containing hydrogen is formed in contact with the oxide semiconductor layer to diffuse hydrogen from the insulating film containing hydrogen to the oxide semiconductor layer, so that the oxide semiconductor layer can have a high carrier density and a low resistance.

The insulating layer 175a is provided over the transistors 116, 117, and 129 to prevent the oxide semiconductor layer 173a from being subjected to the plasma treatment. Since the insulating layer 175a is provided, the oxide semiconductor layer 173a is not in contact with the insulating film 175 containing hydrogen. The insulating layer 175a can be formed using an insulating film capable of releasing oxygen, in which case oxygen can be supplied to the oxide semiconductor layer 173a. The oxide semiconductor layer 173a to which oxygen is supplied is an oxide semiconductor in which oxygen vacancies in the film or at the interface are reduced and which has a high resistance. Note that as the insulating film capable of releasing oxygen, a silicon oxide film or a silicon oxynitride film can be used, for example.

As the plasma treatment to be performed on the oxide conductor layer 173b, plasma treatment using a gas containing one of a rare gas (He, Ne, Ar, Kr, or Xe), phosphorus, boron, hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, an oxygen vacancy is formed in a lattice from which oxygen is released (or in a portion from which oxygen is released) in the oxide conductor layer 173b. This oxygen vacancy can cause carrier generation. Further, when hydrogen is supplied from an insulating film that is in the vicinity of the oxide conductor layer 173b, specifically, that is in contact with the lower surface or the upper surface of the oxide conductor layer 173b, and hydrogen enters the oxygen vacancy, an electron serving as a carrier might be generated. Accordingly, the oxide conductor layer 173b whose oxygen vacancies are increased by the plasma treatment has a higher carrier density than the oxide semiconductor layer 173a.

The oxide semiconductor layer 173a in which oxygen vacancies are reduced and the hydrogen concentration is reduced can be referred to as a highly purified intrinsic or substantially highly purified intrinsic oxide semiconductor layer. The term "substantially intrinsic" refers to the state where an oxide semiconductor has a carrier density lower than $1\times10^{17}/cm^3$, preferably lower than $1\times10^{15}/cm^3$, further preferably lower than $1\times10^{13}/cm^3$. Furthermore, the state in which an impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). The highly purified intrinsic or substantially highly purified intrinsic oxide semiconductor layer 173a has a low density of defect states and accordingly can have a low density of trap states.

Furthermore, the highly purified intrinsic or substantially highly purified intrinsic oxide semiconductor layer 173a has an extremely low off-state current; even when an element has a channel width of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode in the range from 1 V to 10 V. Thus, the transistor 117 whose channel region is formed in the oxide semiconductor layer 173a has a small change in electrical characteristics and is highly reliable.

The insulating layer 175a in FIG. 9 is formed in such a manner that the insulating film that overlaps with the oxide conductor layer 173b functioning as the electrode of the sensor element is selectively removed. The insulating layer 175 formed in contact with the oxide conductor layer 173b may be removed from the oxide conductor layer 173b. For example, an insulating film containing hydrogen, that is, an insulating film capable of releasing hydrogen, typically, a silicon nitride film, is used as the insulating film 314, whereby hydrogen can be supplied to the oxide conductor layer 173b. The insulating film capable of releasing hydrogen preferably has a hydrogen concentration of $1\times10^{22}$ atoms/cm$^3$ or higher. Such an insulating film is formed in contact with the oxide conductor layer 173b, whereby hydrogen can be effectively contained in the oxide conductor layer 173b. In this manner, the above-described plasma treatment is performed and the structure of the insulating film in contact with the oxide semiconductor layer (or the oxide conductor layer) is changed, whereby the resistance of the oxide semiconductor layer (or the oxide conductor layer) can be appropriately adjusted.

Hydrogen contained in the oxide conductor layer 173b reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated. Further, in some cases, bonding of part of hydrogen to oxygen bonded to a metal element causes generation of an electron serving as a carrier. Thus, the oxide conductor layer 173b containing hydrogen has a higher carrier density than the oxide semiconductor layer 173a.

Hydrogen in the oxide semiconductor layer 173a of the transistor 117 in which a channel region is formed is preferably reduced as much as possible. Specifically, in the oxide semiconductor layer 173a, the hydrogen concentration measured by secondary ion mass spectrometry (SIMS) is set to lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$.

On the other hand, the oxide conductor layer 173b functioning as the electrode of the sensor element is a low-resistance oxide conductor layer having a high hydrogen concentration and/or a large amount of oxygen vacancies as compared to the oxide semiconductor layer 173a.

The oxide semiconductor layer 173a and the oxide conductor layer 173b are typically formed using a metal oxide such as an In—Ga oxide, an In—Zn oxide, or an In—M-Zn oxide (M is Mg, Al, Ti, Ga, Y, Zr, La, Ce, Nd, or Hf). Note that oxide semiconductor layer 173a and the oxide conductor layer 173b have a light-transmitting property.

Note that in the case where the oxide semiconductor layer 173 a is an In—M-Zn oxide, when the summation of In and M is assumed to be 100 atomic %, the proportions of In and M are preferably set to be greater than or equal to 25 atomic % and less than 75 atomic %, respectively, or greater than or equal to 34 atomic % and less than 66 atomic %, respectively.

The energy gap of the oxide semiconductor layer 173a is 2 eV or more, 2.5 eV or more, or 3 eV or more.

The thickness of the oxide semiconductor layer 173 a can be greater than or equal to 3 nm and less than or equal to 200 nm, greater than or equal to 3 nm and less than or equal to 100 nm, or greater than or equal to 3 nm and less than or equal to 60 nm.

Further, in the case where the oxide semiconductor layer 173a is an In—M-Zn oxide, the atomic ratio of metal elements of a sputtering target used for forming the In—M-Zn oxide preferably satisfies In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratio of metal elements in the formed oxide semiconductor layer 173 a varies from the above atomic ratio of metal elements of the sputtering target within a range of ±40% as an error.

Modification Example 2

Figure 10:
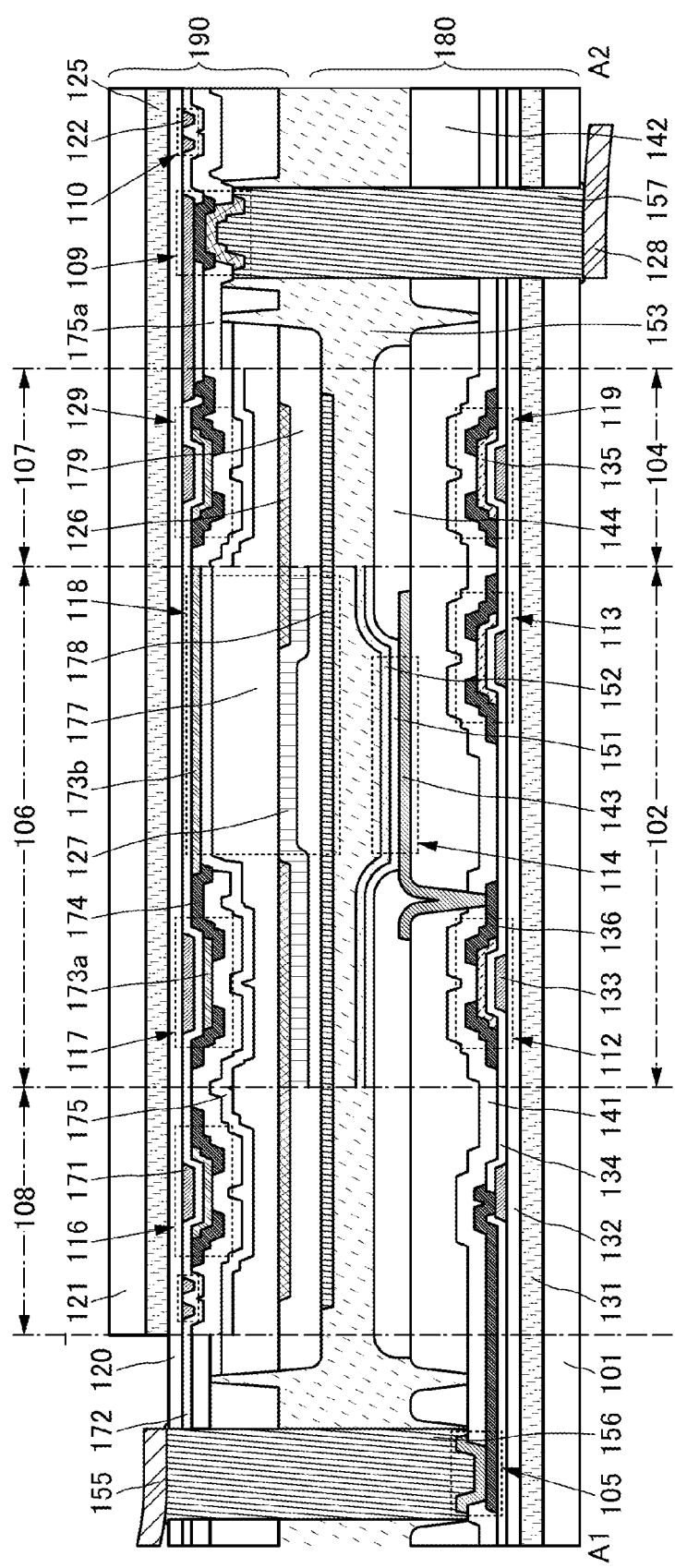
FIG. 10 illustrates a structure example of an input/output device of one embodiment.

FIG. 10 is a cross-sectional schematic view of the touch panel 100 of one embodiment of the present invention in which one electrode of the sensor element 118 is formed in the same process as a semiconductor layer. The main difference of FIG. 10 from FIG. 9 is that the conductive layer 178, which is the other electrode of a sensor element, is formed closer to the light-emitting element 114 than the color filer 127. The differences from FIG. 9 will be described.

The black matrix 126 and the color filter 127 are provided over the insulating layer 177. The conductive layer 178 is provided over the color filter 127 and the black matrix 126 with the insulating layer 179 therebetween. Note that the conductive layer 178 may be provided directly on the color filter 127 and the black matrix 126 without the insulating layer 179. An insulating layer may be provided over the conductive layer 178.

The conductive layer 178 is provided far from the oxide conductor layer 173b, which is one electrode of the sensor element 118, so that the capacitance of the sensor element 118 can be small. The sensitivity of the input device 190 can thus be high.

Since the conductive layer 178 is in contact with the sealing layer 153, the wettability can be high. Consequently, bubbles generated between the sealing layer 153 and the conductive layer 178 can be inhibited when the sealing layer 153 is formed on the sensor element 118 side of the support substrate 161 (see FIG. 6).

Note that the structure in which one of the pair of electrodes of the sensor element 118 is formed closer to the light-emitting element 114 than the color filer 127 is also one embodiment of the present invention. The structure in which one of the pair of electrodes of the sensor element 118 is in contact with the sealing layer 153 is also one embodiment of the present invention.

Specifically, one embodiment of the present invention is an input/output device including a first flexible substrate, a second flexible substrate, an input device, a light-emitting device, and a color filter. A first surface of the first flexible substrate faces a second surface of the second flexible substrate. The input device and the color filter are provided on the first surface side of the first flexible substrate. The input device includes a transistor and a sensor element. The sensor element includes a pair of electrodes and a dielectric layer. The dielectric layer is provided between the pair of electrodes. One of the pair of electrodes is positioned between the color filter and the second flexible substrate when seen from the direction parallel to the first surface. The transistor and the sensor element are electrically connected to each other. The light-emitting element is provided on the second surface of the second flexible substrate.

One embodiment of the present invention is an input/output device including a first flexible substrate, a second flexible substrate, an input device, a light-emitting device, and a sealing layer. A first surface of the first flexible substrate faces a second surface of the second flexible substrate. The input device is provided on the first surface side of the first flexible substrate. The input device includes a transistor and a sensor element. The sensor element includes a pair of electrodes and a dielectric layer. The dielectric layer is provided between the pair of electrodes. The sealing layer bonds the first surface and the second surface. One of the pair of electrodes is in contact with the sealing layer. The transistor and the sensor element are electrically connected to each other. The light-emitting element is provided on the second surface side of the second flexible substrate.

Although the touch panel including the light-emitting element is described in this embodiment as an example, one embodiment of the present invention is not limited thereto. There are other semiconductor devices and display devices in which the flexible substrate characterized by one embodiment of the present invention can be used. For example, substrates in the following elements or devices can be the flexible substrate of one embodiment of the present invention: an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD), a MEMS shutter display element, an optical interference type MEMS display element, an electrowetting element, a piezoelectric ceramic display, or a carbon nanotube, which are display media whose contrast, luminance, reflectivity, transmittance, or the like is changed by electromagnetic action. In addition, a display device having electron emitters, such as a field emission display (FED) or an SED-type flat panel display (SED: surface-conduction electron-emitter display) may be used. A display device having a liquid crystal element, such as a liquid crystal display (e.g., a transmissive liquid crystal display, a transflective liquid crystal display, a reflective liquid crystal display, a direct-view liquid crystal display, or a projection liquid crystal display) may be used. A display device including electronic ink, electronic liquid powder, or electrophoretic elements, such as electronic paper may be used. In the case of a transflective liquid crystal display or a reflective liquid crystal display, some of or all of pixel electrodes function as reflective electrodes. For example, some or all of pixel electrodes are formed to contain aluminum, silver, or the like, and a memory circuit such as an SRAM can be provided under the reflective electrodes, leading to lower power consumption.

Note that this embodiment can be combined with any of the other embodiments and examples described in this specification as appropriate.

Embodiment 2

In Embodiment 2, a structure of a touch panel in which an image display device is incorporated with an input device and a driving method of a sensor circuit included in the touch panel will be described as an example of an input/output device of one embodiment of the present invention.

Note that the input device can also be referred to as a touch sensor.

The touch panel of one embodiment of the present invention includes an active matrix touch sensor and a display element between a pair of substrates. The touch sensor is a capacitive type touch sensor, for example. Note that an active matrix touch sensor in this specification refers to a touch sensor including an active element in each sensor unit.

In a touch panel including a sensor portion and a display portion that overlap with each other, a parasitic capacitance is formed in some cases between a wiring or an electrode included in a capacitive type touch sensor and a wiring or an electrode included in the display portion. Noise caused by operating the display element travels to the touch sensor side through the parasitic capacitance and the detection sensitivity of the touch sensor might decrease.

By sufficiently increasing the distance between the sensor portion and the display portion, the adverse effect of the noise can be avoided and the decrease in the detection sensitivity of the touch sensor can be suppressed; however, the thickness of the whole touch panel is increased in some cases.

In one embodiment of the present invention, an active matrix touch sensor is provided. The touch sensor includes a transistor and a sensor element. The transistor and the sensor element are electrically connected to each other.

In the active matrix touch sensor of one embodiment of the present invention, an electrode of a capacitor and a read wiring can be formed in different layers. When the read wiring has a narrow width, the bad effect of noise can be suppressed. Accordingly, a decrease in the detection sensitivity of the touch sensor can be suppressed. In one embodiment of the present invention, a detection signal is amplified and the amplified signal is output; thus, the adverse effect of the parasitic capacitance can be suppressed.

An active matrix touch sensor is used in the touch panel of one embodiment of the present invention, whereby the distance between the sensor portion and the display portion can be reduced in the touch panel, and the touch panel can have a small thickness. Furthermore, the touch sensor and the display element can be located between two substrates, whereby the touch panel can have a small thickness. Here, using the touch sensor of one embodiment of the present invention can suppress a decrease in the detection sensitivity of the touch sensor even when the distance between the sensor portion and the display portion is reduced. Therefore, in one embodiment of the present invention, both thickness reduction and high detection sensitivity of a touch sensor or a touch panel can be achieved. Furthermore, by using a flexible material for the pair of substrates of the touch panel, the touch panel can have flexibility. Furthermore, in one embodiment of the present invention, a touch panel with high resistance to repeated bending can be provided. Furthermore, a large-sized touch panel can be provided.

The touch sensor included in the touch panel of one embodiment of the present invention may include the oxide conductor layer as the electrode of the sensor element as described in detail in Embodiment 1. In the active matrix touch sensor, a semiconductor layer and a conductive film of the transistor and the electrode of the sensor element are preferably formed in the same step. Thus, the number of steps of manufacturing the touch panel can be reduced and the cost of manufacturing the touch panel can be reduced.

Note that because the oxide conductor layer is used as the electrode of the sensor element in the touch panel of one embodiment of the present invention, viewing angle dependence is smaller than that of a touch panel using another material as the electrode of the sensor element in some cases. Furthermore, because the oxide conductor layer is used as the electrode of the sensor element in the touch panel of one embodiment of the present invention, an NTSC ratio can be higher than that of a touch panel using another material as the electrode of the sensor element.

Specifically, one embodiment of the present invention is a touch panel including a touch sensor, a light-blocking layer, and a display element between a pair of substrates. In the touch panel, the light-blocking layer is located between the touch sensor and the display element, the light-blocking layer includes a portion overlapping with a transistor included in the touch sensor, and the display element includes a portion overlapping with a sensor element included in the touch sensor.

The display element can be, but is not particularly limited to, an organic EL element. Therefore, in the above structure, a first electrode, a second electrode, and a layer including a light-emitting organic compound may be included in the display element; an insulating film covering an end portion of the first electrode may be included; the layer including a light-emitting organic compound may be located between the first electrode and the second electrode; and the insulating film may include a portion overlapping with the transistor included in the touch sensor.

<Structure Example of Touch Panel>

FIGS. 11A to 11C are projection views illustrating components of a touch panel of one embodiment of the present invention. FIG. 11A is a projection view of a touch panel 500 of one embodiment of the present invention, and FIG. 11B is a projection view illustrating a structure of a sensor unit 10U included in the touch panel 500.

The touch panel 500 described in this embodiment includes a flexible input device 300 and a display device 501. The flexible input device 300 includes the sensor portion 10 including a plurality of sensor units 10U arranged in matrix and each provided with window portions 14 transmitting visible light, a scan line G1 electrically connected to a plurality of sensor units 10U placed in the row direction (indicated by arrow R in the drawing), a signal line DL electrically connected to a plurality of sensor units 10U placed in the column direction (indicated by arrow C in the drawing), and a flexible first base material 16 supporting the sensor portion 10, the scan line G1, and the signal line DL. The display device 501 includes a plurality of pixels 502 overlapping with the window portions 14 and arranged in matrix and a flexible second base material 510 supporting the pixels 502 (see FIGS. 11A to 11C).

The sensor unit 10U includes a sensor element C overlapping with the window portion 14 and a sensor circuit 19 electrically connected to the sensor element C.

The sensor element 118 in Embodiment 1 can be used as the sensor element C. FIG. 11B specifically shows the conductive layer 178 and the oxide semiconductor layer 173b, which are a pair of electrodes of the sensor element C.

The sensor circuit 19 is supplied with a selection signal, and supplies a sensor signal DATA in accordance with a change in the capacitance of the sensor element C.

The scan line G1 can supply a selection signal. The signal line DL can supply the sensor signal DATA. The sensor circuit 19 is provided so as to overlap with a gap between the window portions 14.

In addition, the touch panel 500 described in this embodiment includes a coloring layer between the sensor unit 10U and the pixel 502 overlapping with the window portion 14 of the sensor unit 10U.

The touch panel 500 described in this embodiment includes the flexible input device 300 including the plurality of sensor units 10U, each of which is provided with the window portions 14 transmitting visible light, and the flexible display device 501 including the plurality of pixels 502 overlapping with the window portions 14. The coloring layer is included between the window portion 14 and the pixel 502.

With such a structure, the touch panel can supply a sensor signal based on the change in the capacitance or the parasitic capacitance and positional information of the sensor unit supplying the sensor signal, can display image data relating to the positional information of the sensor unit, and can be bent. As a result, a novel touch panel with high convenience or high reliability can be provided.

The touch panel 500 includes, over the flexible first base material 16, a sensor portion 10 and a crack inhibiting region 110 surrounding a scan line driver circuit GD and a sensor CONY. Through the above process, a touch panel with fewer defects caused by a crack and high reliability can be provided.

The touch panel 500 may include a flexible substrate FPC1 to which a signal from the input device 300 is supplied and/or a flexible substrate FPC2 supplying a signal including image data to the display device 501.

In addition, a protective layer 17p protecting the touch panel 500 by preventing damage and/or an anti-reflective layer 567p that weakens the intensity of external light reflected by the touch panel 500 may be included.

Moreover, the touch panel 500 includes a scan line driver circuit 503g which supplies the selection signal to a scan line of the display device 501, a wiring 511 supplying a signal, and a terminal 519 electrically connected to the flexible substrate FPC2.

Components of the touch panel 500 are described below. Note that these units cannot be clearly distinguished and one unit also serves as another unit or include part of another unit in some cases.

For example, the input device 300 including the coloring layer overlapping with the plurality of window portions 14 also serves as a color filter.

Furthermore, for example, the touch panel 500 in which the input device 300 overlaps the display device 501 serves as the input device 300 as well as the display device 501.

The touch panel 500 includes the input device 300 and the display device 501 (see FIG. 11A).

The input device 300 includes the sensor portion 10 including the plurality of sensor units 10U and the flexible base material 16 supporting the sensor units. For example, the plurality of sensor units 10U is arranged in matrix with 40 rows and 15 columns on the flexible base material 16.

The window portion 14 transmits visible light.

For example, the window portion 14 may be formed as follows: the base material 16, the sensor element C, and a flexible protective base material 17 each formed using a material transmitting visible light or a material thin enough to transmit visible light overlap with each other so that transmission of visible light is not prevented.

For example, an opening portion may be provided in a material that does not transmit visible light. Specifically, one opening portion or a plurality of opening portions having any of a variety of shapes such as a rectangle may be provided.

A coloring layer that transmits light of a predetermined color is provided to overlap with the window portion 14. For example, a coloring layer CFB transmitting blue light, a coloring layer CFG, and a coloring layer CFR are included (FIG. 11B).

Note that, in addition to the coloring layers transmitting blue light, green light, and/or red light, coloring layers transmitting light of various colors such as a coloring layer transmitting white light and a coloring layer transmitting yellow light can be included.

For a coloring layer, a metal material, a resin material, a pigment, dye, or the like can be used.

A light-blocking layer BM is provided to surround the window portions 14. The light-blocking layer BM does not easily transmit light as compared to the window portion 14.

For the light-blocking layer BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 19 are provided to overlap with the light-blocking layer BM.

Note that a light-transmitting overcoat covering the coloring layer and the light-blocking layer BM can be provided.

As the flexible base material 16 and the base material 510, an organic material, an inorganic material, or a composite material of an organic material and an inorganic material can be used.

For the base material 16, a material with a thickness of 5 μm or more and 2500 μm or less, preferably 5 μm or more and 680 μm or less, further preferably 5 μm or more and 170 μm or less, further preferably 5 μm or more and 45 μm or less, further preferably 8 μm or more and 25 μm or less can be used.

A material with which unintended passage of impurities is inhibited can be favorably used for the base material 510. For example, a material with a vapor permeability of lower than or equal to $10^{-5}$ g/(m².day), preferably lower than or equal to $10^{-6}$ g/(m².day) can be favorably used.

The base material 16 can be favorably formed using a material whose coefficient of linear expansion is substantially equal to that of the base material 16.

For example, the base material 16 can each be formed using a material whose coefficient of linear expansion is preferably lower than or equal to $1\times10^{-3}$/K, further preferably lower than or equal to $5\times10^{-5}$/K, and still further preferably lower than or equal to $1\times10^{-5}$/K.

Examples of the base material 16 are organic materials such as a resin, a resin film, and a plastic film.

Examples of the base material 16 is an inorganic material such as a metal plate and a thin glass plate with a thickness of more than or equal to 10 µm and less than or equal to 50 µm.

An example of the base material 16 is a composite material in which a metal plate, a thin glass plate, or a film of an inorganic material is bonded to a resin film or the like with a resin layer.

An example of the base material 16 is a composite material in which a fibrous or particulate metal, glass, or an inorganic material is dispersed into resin or a resin film.

The resin layer can be formed using a thermosetting resin or an ultraviolet curable resin.

Specifically, a resin film or resin plate of polyester, polyolefin, polyamide, polyimide, polycarbonate, an acrylic resin, or the like can be used.

Specifically, non-alkali glass, soda-lime glass, potash glass, crystal glass, or the like can be used.

Specifically, a metal oxide film, a metal nitride film, a metal oxynitride film, or the like can be used. For example, a silicon oxide film, a silicon nitride film, a silicon oxynitride film, an alumina film, or the like can be used.

Specifically, SUS, aluminum, or the like in which an opening portion is provided can be used.

Specifically, an acrylic resin, a urethane resin, an epoxy resin, or a resin having a siloxane bond can be used.

As the base material 16, a lamination of the substrate 121, the buffer layer 120 for suppressing impurity diffusion, and the bonding layer 125 for bonding the substrate 121 and the buffer layer 120 can be preferably used, for example (see FIG. 2).

As the base material 510, a lamination of the substrate 101, the buffer layer 132 for suppressing impurity diffusion, and the bonding layer 131 for bonding the substrate 101 and the buffer layer 132 can be preferably used, for example (see FIG. 2).

Specifically, a film including a lamination of a 600-nm-thick silicon oxynitride film and a 200-nm-thick silicon nitride film can be used as the buffer layer 120 and/or the buffer layer 132.

A film including a layered material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the barrier layer 120 and/or the buffer layer 132.

A flexible protective base material 17 and/or the protective layer 17*p* can be provided. The flexible protective base material 17 or the protective layer 17*p* protects the input device 300 by preventing damage.

For example, a resin film or resin plate of polyester, polyolefin, polyamide, polyimide, polycarbonate, an acrylic resin, or the like, a stack of the above materials, or the like can be used for the flexible protective base material 17.

For example, a hard coat layer or a ceramic coat layer can be used as the protective layer 17*p*. Specifically, a layer containing a UV curable resin or aluminum oxide may be formed to overlap with the second electrode.

The display device 501 includes a plurality of pixels 502 arranged in matrix (FIG. 11C). For example, the pixel 502 includes a sub-pixel 502B, a sub-pixel 502G, and a sub-pixel 502R, and each sub-pixel includes a display element and a pixel circuit for driving the display element.

Note that in the pixel 502, the sub-pixel 502B is located to overlap with the coloring layer CFB, the sub-pixel 502G is located to overlap with the coloring layer CFG, and the sub-pixel 502R is located to overlap with the coloring layer CFR.

In this embodiment, an example of using an organic EL element that emits white light as a display element will be described; however, the display element is not limited to such an element.

For example, organic EL elements that emit light of different colors may be included in sub-pixels so that the light of different colors can be emitted from the respective sub-pixels.

In the display device, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

As a method other than an active matrix method, a passive matrix method in which an active element (a non-linear element) is not used can also be used. Since an active element (a non-linear element) is not used, the number of manufacturing steps is small, so that manufacturing cost can be reduced or yield can be improved.

Alternatively, since an active element (a non-linear element) is not used, the aperture ratio can be improved, so that power consumption can be reduced or higher luminance can be achieved, for example.

The display device 501 may include the anti-reflective layer 567*p* positioned in a region overlapping with pixels. As the anti-reflective layer 567*p*, a circular polarizing plate can be used, for example.

The display device 501 includes the wiring 511 through which a signal can be supplied. The wiring 511 is provided with the terminal 519. Note that the flexible substrate FPC2 through which a signal such as an image signal or a synchronization signal can be supplied is electrically connected to the terminal 519.

Note that a printed wiring board (PWB) may be attached to the flexible substrate FPC2.

An electronic device of one embodiment of the present invention may include a touch panel and a secondary battery. It is preferable that the secondary battery is capable of being charged by contactless power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include a touch panel and an antenna. Receiving a signal with the antenna enables a display device to display video, information, and the like. When the touch panel includes a secondary battery, the antenna may be used for non-contact power transmission.

<<Sensor Element C>>

An example of the sensor element C is described using the sensor element 118 illustrated in FIG. 9. The sensor element 118 includes the oxide conductor layer 173b and the conductive layer 178, which are a pair of electrodes. The insulating layers 175 and 177 are included as dielectric layers between the pair of electrodes.

The oxide conductor layer 173b is formed apart from other regions, for example, is formed into an island shape. A layer that can be formed in the same process as that of the oxide conductor layer 173b is preferably located close to the oxide conductor layer 173b so that the user of the touch panel 500 does not recognize the oxide conductor layer 173b. Further preferably, the number of the window portions 14 located in the gap between the oxide conductor layer 173b and the layer located close to the oxide conductor layer 173b is reduced as much as possible. It is particularly preferred that the window portions 14 not be provided in the gap.

The conductive film 178 is provided to overlap with the oxide conductor layer 173b, and the dielectric layer (here, the insulating films 175 and 177) is provided between the oxide conductor layer 173b and the conductive film 178.

When an object whose dielectric constant is different from that of the air gets closer to one of the pair of electrodes of the sensor element C that is put in the air, the capacitance of the sensor element C is changed. Specifically, when a finger or the like gets closer to the sensor element C, the capacitance of the sensor element C is changed. Accordingly, the sensor element C can be used in a proximity sensor.

In one embodiment of the present invention, the sensor element C is not limited to the sensor element 118 described in Embodiment 1.

For example, the capacitance of the sensor element C that can change its form varies with the change in the form of the sensor element C.

Specifically, when a finger or the like is in contact with the sensor element C, and the gap between the pair of electrodes becomes small, the capacitance of the sensor element C is increased. Accordingly, the sensor element C can be used in a tactile sensor.

Alternatively, when the sensor element C is folded, the gap between the pair of electrodes becomes small. Consequently, the capacitance of the sensor element C increases. Accordingly, the sensor element C can be used in a bend sensor.

The pair of electrodes include a conductive material.

For example, an inorganic conductive material, an organic conductive material, a metal material, a conductive ceramic material, or the like can be used for each of the pair of electrodes.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used.

Alternatively, a conductive oxide such as indium oxide, indium tin oxide, indium zinc oxide, zinc oxide, zinc oxide to which gallium is added, or the like can be used.

Alternatively, graphene or graphite can be used. The film including graphene can be formed, for example, by reducing a film containing graphene oxide. As a reducing method, a method using heat, a method using a reducing agent, or the like can be employed.

Alternatively, a conductive polymer can be used. Note that the structure and the formation method of the oxide conductor layer which are given in Embodiment 1 can be referred to.

<<Sensor Circuit 19 and Converter CONV>>

FIGS. 12A, 12B-1, 12B-2 and 12C illustrate the configuration and driving methods of the sensor circuit 19 and the converter CONV according to one embodiment of the present invention.

Figure 13A:
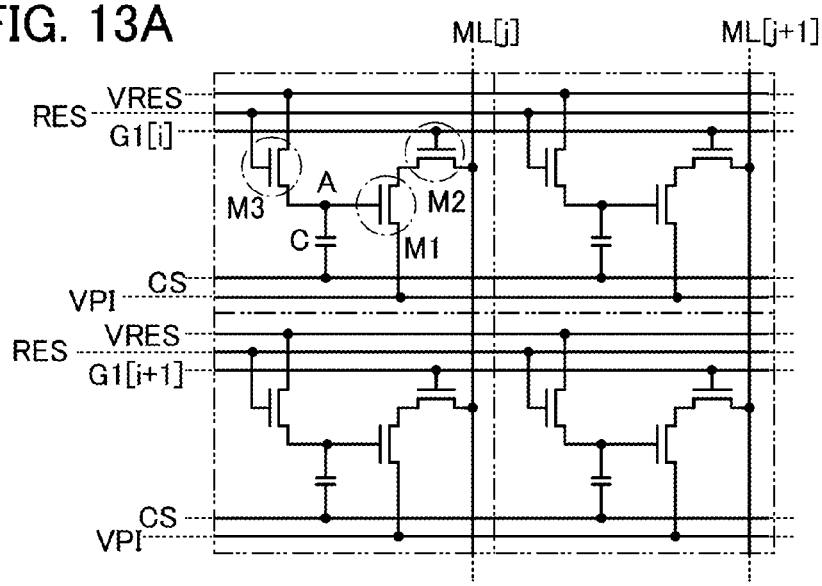
FIGS. 13A to 13C illustrate examples of a sensor circuit and a top view of a pixel.

FIG. 12A is a circuit diagram illustrating the configuration of the sensor circuit 19 and the converter CONV, which is one embodiment of the present invention. FIGS. 12B-1 and 12B-2 are timing charts illustrating the driving methods. FIG. 12C shows a converter CONV different from FIG. 12A. FIG. 13A shows the sensor circuits 19 arranged in matrix.

The sensor circuit 19 includes transistors M1, M2, and M3, for example (FIG. 12A and FIG. 13A). The sensor circuit 19 further includes wirings that supply a power supply potential and a signal. For example, the wiring VPI, a wiring CS, the scan line G1, the wiring RES, the wiring VRES, the signal line DL, and the like are included.

Note that the sensor circuit 19 may be located not to overlap with the window portion 14. For example, a wiring is located not to overlap with the window portion 14, whereby one side of the input device 300 can be visually recognized easily from the other side.

Furthermore, the transistors M1 to M3 each include a semiconductor layer. For example, for the semiconductor layer, an element belonging to Group 4, a compound semiconductor, or an oxide semiconductor can be used. Specifically, a semiconductor containing silicon, a semiconductor containing gallium arsenide, an oxide semiconductor containing indium, or the like can be used.

Transistors that can be formed in the same process can be used as the transistors M1 to M3.

Any one of the transistors M1 to M3 preferably includes an oxide semiconductor layer. At this time, the oxide semiconductor layer and the oxide conductor layer are preferably located over the same surface. The off-state current of a transistor including an oxide semiconductor layer is small; therefore, it is particularly preferable that the transistor M1 include the oxide semiconductor layer.

For the wiring, a conductive material can be used.

For example, an inorganic conductive material, an organic conductive material, a metal material, a conductive ceramic material, or the like can be used for the wiring. Specifically, a material that is the same as those of the pair of electrodes of the sensor element can be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 19 may be formed over the base material 16 by processing a film formed over the base material 16.

Alternatively, the sensor circuit 19 formed over another base material may be transferred to the base material 16.

Various circuits that can convert the sensor signal DATA supplied from the sensor unit 10U and supply the converted signal to the FPC1 can be used as a converter CONV. For example, a transistor M4 can be used in the converter CONV as shown in FIG. 12A. Furthermore, as shown in FIG. 12C, the transistor M4 and a transistor M5 can be used in the converter CONV.

The sensor circuit 19 of one embodiment of the present invention includes the first transistor M1 whose gate is electrically connected to one electrode (here, the oxide conductor layer 173b) of the sensor element C and whose first electrode is electrically connected to the wiring VPI (FIG. 12A). The wiring VPI can supply, for example, a ground potential.

Furthermore, the second transistor M2 whose gate is electrically connected to the scan line G1, whose first electrode is electrically connected to a second electrode of the first transistor M1, and whose second electrode is electrically connected to the signal line DL may be included. The scan line G1 can supply a selection signal. The signal line DL can supply, for example, the sensor signal DATA.

Furthermore, the third transistor M3 whose gate is electrically connected to the wiring RES, whose first electrode is electrically connected to the one electrode (here, the oxide conductor layer 173b) of the sensor element C, and whose second electrode is electrically connected to the wiring VRES may be included. The wiring RES can supply a reset signal. The wiring VRES can supply, for example, a potential at which the second electrode can be turned on.

The capacitance of the sensor element C is changed when an object gets closer to the oxide conductor layer 173b or the conductive layer 178 or when a gap between the oxide conductor layer 173b and the conductive layer 178 is changed, for example. Thus, the sensor unit 10U can supply the sensor signal DATA based on the change in the capacitance of the sensor element C.

Furthermore, the sensor unit 10U includes the wiring CS that can supply a control signal for controlling the potential of the other electrode (here, the conductive layer 178) of the sensor element C.

Note that a node at which the one electrode (here, the oxide conductor layer 173b) of the sensor element C, the gate of the first transistor M1, and the first electrode of the third transistor are electrically connected to each other is referred to as a node A.

The wirings VRES and VPI can supply a ground potential, for example, and the wiring VPO and the wiring BR each can supply a high power supply potential, for example. Furthermore, the wiring RES can supply the reset signal, and the scan line G1 can supply the selection signal. Furthermore, the signal line DL can supply the sensor signal DATA, and a terminal OUT can supply a signal converted based on the sensor signal DATA.

Any of various circuits that can convert the sensor signal DATA and supply the converted signal to the terminal OUT can be used as the converter CONV. For example, a source follower circuit, a current mirror circuit, or the like may be formed by the electrical connection between the converter CONV and the sensor circuit 19.

Specifically, by using the converter CONV including the transistor M4, a source follower circuit can be formed (FIG. 12A). Furthermore, as shown in FIG. 12C, the converter CONV may include the transistors M4 and M5. Note that transistors that can be formed in the same process as those of the first transistor M1 to the third transistor M3 may be used as the transistors M4 and M5. A gate of the transistor M4 is electrically connected to a wiring VPOG, a first electrode of the transistor M4 is electrically connected to a wiring ML[j] and a second electrode of the transistor M4 is electrically connected to a wiring VPO. A gate of the transistor M5 is electrically connected to the first electrode of the transistor M4, a first electrode of the transistor M5 is electrically connected to a wiring SF_GND and a second electrode of the transistor M5 is electrically connected to a terminal OUT[j].

Figure 13B:
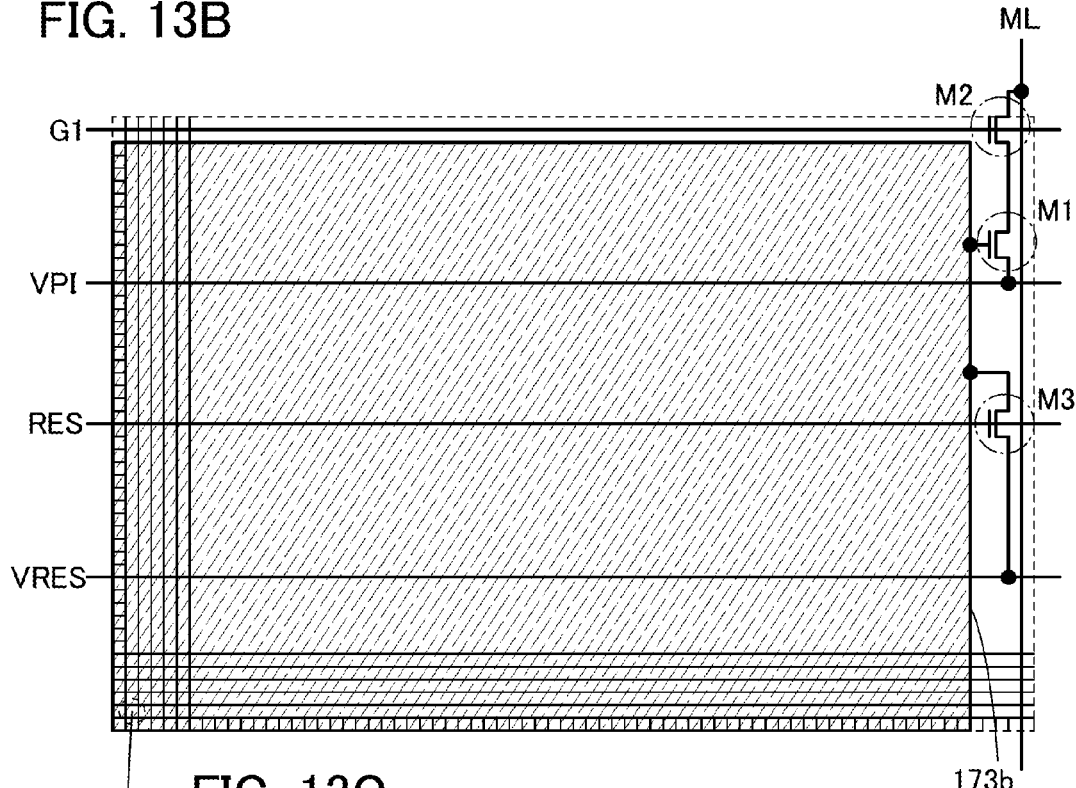
Figure 13C:
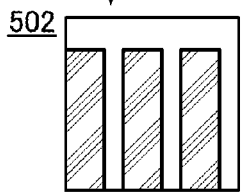

As described above, in the active matrix touch sensor of one embodiment of the present invention, the electrode of the sensor element and the read wiring can be formed in different layers. As shown in FIG. 13B, the oxide conductor layer 173b that is the one electrode of the sensor element and the wiring ML are formed in different layers, and the width of the wiring ML is made narrow. Thus, the effect of noise can be suppressed. Accordingly, a decrease in the detection sensitivity of the touch sensor can be suppressed. Note that the oxide conductor layer 173b overlaps with the plurality of pixels 502 shown in FIG. 13C that is an enlarged view.

<Driving Method of Sensor Circuit 19>

A driving method of the sensor circuit 19 is described.

<<First Step>>

In a first step, a reset signal that turns on and then turns off the third transistor M3 is supplied to the gate, and the potential of the first electrode of the sensor element C is set to a predetermined potential (see a period T1 in FIG. 12B1).

Specifically, the reset signal is supplied from the wiring RES. The third transistor M3 to which the reset signal is supplied sets the node A to be grounded, for example (FIG. 12A).

<<Second Step>>

In a second step, a selection signal that turns on the second transistor M2 is supplied to the gate of the second transistor M2, and the second electrode of the first transistor M1 is electrically connected to the signal line DL.

Specifically, the selection signal is supplied from the scan line G1. Through the second transistor M2 to which the selection signal is supplied, the second electrode of the first transistor M1 is electrically connected to the signal line DL (see a period T2 in FIG. 12B1).

<<Third Step>>

In a third step, a control signal is supplied to the second electrode of the sensor element C, and a potential changed based on the control signal and the capacitance of the sensor element C is supplied to the gate of the first transistor M1.

Specifically, a rectangular wave control signal is supplied to the second electrode of the sensor element C through the wiring CS, whereby the potential of the node A is increased based on the capacitance of the sensor element C (see the latter half in the period T2 in FIG. 12B1).

Meanwhile, in the case where the sensor element is put in the air, when an object whose dielectric constant is higher than that of the air is located closer to the second electrode of the sensor element C, the capacitance of the sensor element C is apparently increased.

Thus, the change in the potential of the node A due to the rectangular wave control signal becomes smaller than that in the case where an object whose dielectric constant is higher than that of the air is not located closer (see a solid line in FIG. 12B2).

<<Fourth Step>>

In a fourth step, a signal obtained by the change in the potential of the gate of the first transistor M1 is supplied to the signal line DL.

For example, current that changes on the basis of the change in the potential of the gate of the first transistor M1 is supplied to the signal line DL.

The converter CONV converts the change in the current flowing through the signal line DL into a change in voltage and outputs the voltage.

<<Fifth Step>>

In a fifth step, a selection signal for turning off the second transistor M2 is supplied to the gate of the second transistor.

Note that this embodiment can be combined with any of the other embodiments and examples described in this specification as appropriate.

Embodiment 3

In this embodiment, electronic devices and lighting devices that can be fabricated using the touch panel of one embodiment of the present invention will be described with reference to FIGS. 14A to 14G and FIGS. 15A to 15I.

The touch panel of one embodiment of the present invention has flexibility and thus can be used in electronic devices and lighting devices having flexibility. Furthermore, an electronic device or a lighting device having high reliability and high resistance to repeated bending can be manufactured by one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The touch panel of one embodiment of the present invention has flexibility and therefore can be incorporated along a curved inside/outside wall surface of a house or a building or a curved interior/exterior surface of a car.

Figure 14A:
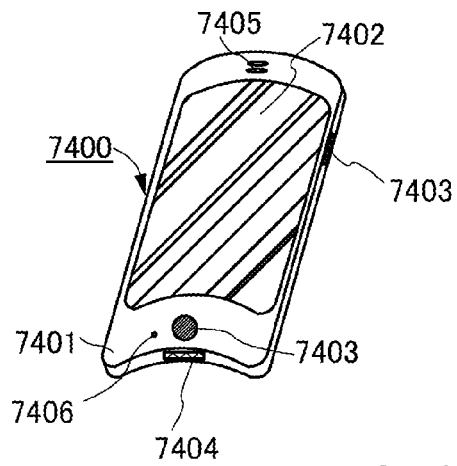
FIGS. 14A to 14G illustrate structure examples of an electronic device and a light-emitting device of one embodiment.

FIG. 14A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured by using the touch panel of one embodiment of the present invention for the display portion 7402. In accordance with one embodiment of the present invention, a highly reliable mobile phone having a curved display portion can be provided at a high yield.

When the display portion 7402 of the mobile phone 7400 illustrated in FIG. 14A is touched with a finger or the like, data can be input into the mobile phone 7400. Further, operations such as making a call and inputting a letter can be performed by touch on the display portion 7402 with a finger or the like.

With the operation buttons 7403, power ON or OFF can be switched. In addition, types of images displayed on the display portion 7402 can be switched; switching images from a mail creation screen to a main menu screen.

Figure 14B:
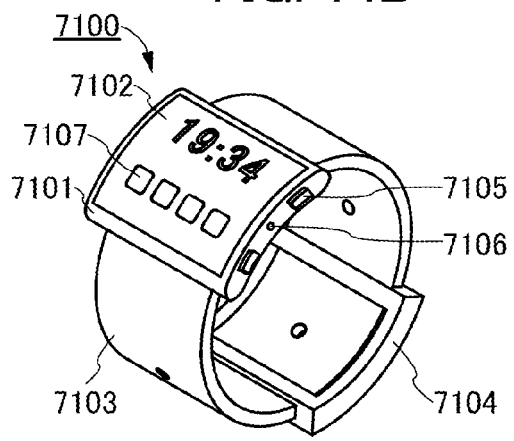

FIG. 14B illustrates an example of a wrist-watch-type portable information terminal A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes the touch panel of one embodiment of the present invention. According to one embodiment of the present invention, a highly reliable portable information terminal having a curved display portion can be provided with a high yield.

Figure 14C:
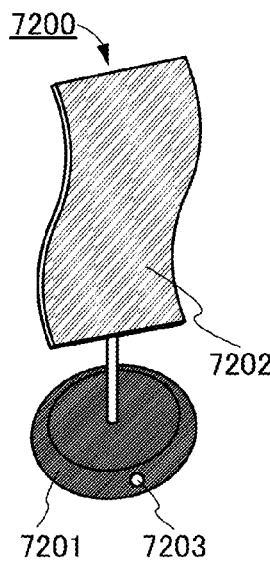
Figure 14D:
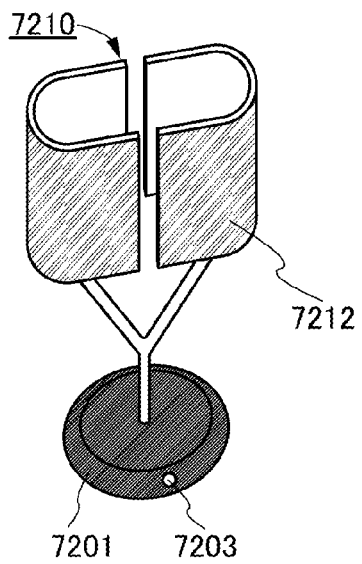
Figure 14E:
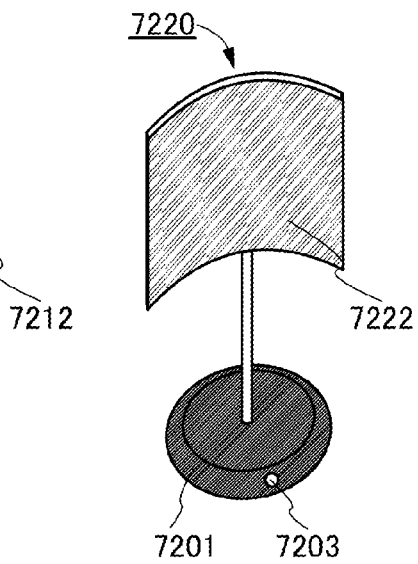

FIGS. 14C to 14E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 14C includes a light-emitting portion 7202 having a wave-shaped light-emitting surface, and thus has good design.

A light-emitting portion 7212 included in the lighting device 7210 illustrated in FIG. 14D has two convex-curved light-emitting portions symmetrically placed. Thus, all directions can be illuminated with the lighting device 7210 as a center.

The lighting device 7220 illustrated in FIG. 14E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, the light-emitting portions each include the touch panel of one embodiment of the present invention. In accordance with one embodiment of the present invention, a highly reliable lighting device having a curved light-emitting portion can be provided at a high yield.

Figure 14F:
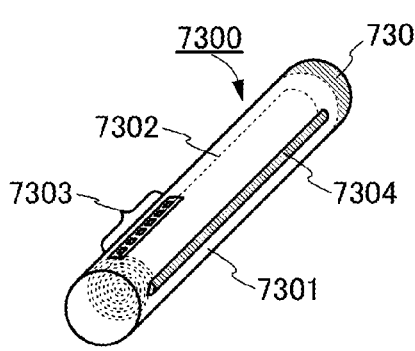

FIG. 14F illustrates an example of a portable touch panel. A touch panel 7300 includes a housing 7301, a display portion 7302, operation buttons 7303, a display portion pull 7304, and a control portion 7305.

The touch panel 7300 includes a rolled flexible display portion 7102 in the cylindrical housing 7301.

The touch panel 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, power ON/OFF, switching of displayed videos, and the like can be performed.

Figure 14G:
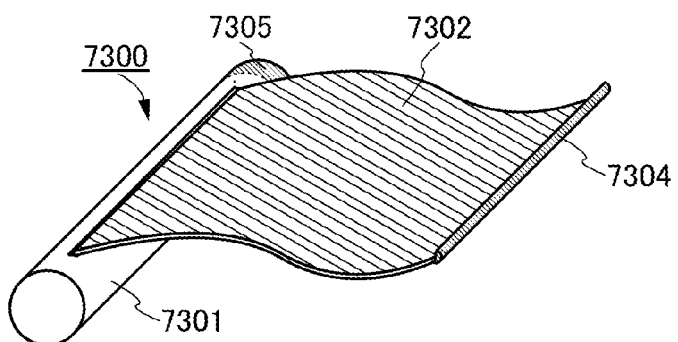

FIG. 14G illustrates a touch panel 7300 in a state where the display portion 7302 is pulled out with the display portion pull 7304. Videos can be displayed on the display portion 7302 in this state. Further, the operation buttons 7303 on the surface of the housing 7301 allow one-handed operation. The operation buttons 7303 are provided not in the center of the housing 7301 but on one side of the housing 7301 as illustrated in FIG. 14F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the touch panel of one embodiment of the present invention. According to one embodiment of the present invention, a lightweight and highly reliable touch panel can be provided with a high yield.

Figure 15A:
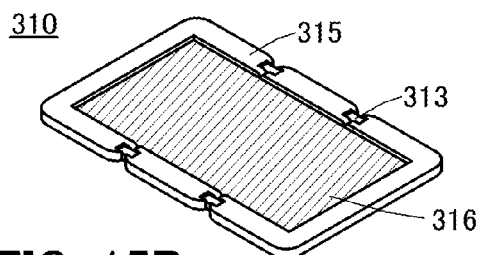
FIGS. 15A to 15I illustrate structure examples of an electronic device of one embodiment.
Figure 15B:
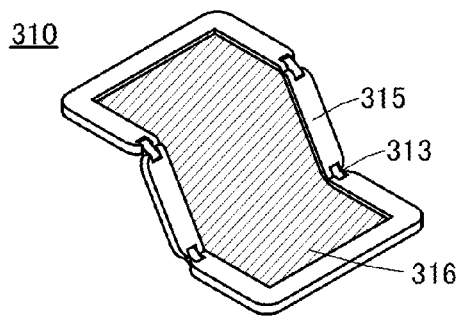
Figure 15C:
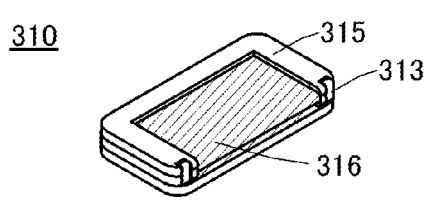

FIGS. 15A to 15C illustrate a foldable portable information terminal 310. FIG. 15A illustrates the portable information terminal 310 that is opened. FIG. 15B illustrates the portable information terminal 310 that is being opened or being folded. FIG. 15C illustrates the portable information terminal 310 that is folded. The portable information terminal 310 is highly portable when folded. When the portable information terminal 310 is opened, a seamless large display region is highly browsable.

A display panel 316 is supported by three housings 315 joined together by hinges 313. By folding the portable information terminal 310 at a connection portion between two housings 315 with the hinges 313, the portable information terminal 310 can be reversibly changed in shape from an opened state to a folded state. The touch panel according to one embodiment of the present invention can be used for the display panel 316. For example, a touch panel that can be bent with a radius of curvature of greater than or equal to 1 mm and less than or equal to 150 mm can be used.

Note that in one embodiment of the present invention, a sensor that senses whether the touch panel is in a folded state or an unfolded state and supplies sensor data may be used. The operation of a folded portion (or a portion that becomes invisible by a user by folding) of the touch panel may be stopped by a control device through the acquisition of data indicating the folded state of the touch panel. Specifically, display of the portion may be stopped, and furthermore, sensing by the touch sensor may be stopped.

Similarly, the control device of the touch panel may acquire data indicating the unfolded state of the touch panel to resume displaying and sensing by the touch sensor.

Figure 15D:
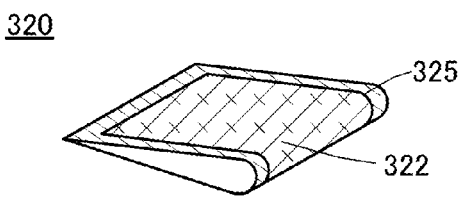
Figure 15E:
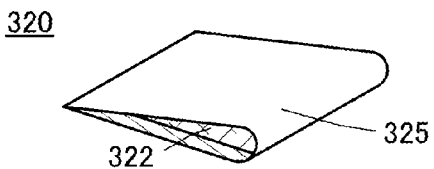

FIGS. 15D and 15E each illustrate a foldable portable information terminal 320. FIG. 15D illustrates the portable information terminal 320 that is folded so that a display portion 322 is on the outside. FIG. 15E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. The touch panel in one embodiment of the present invention can be used for the display portion 322.

Figure 15F:
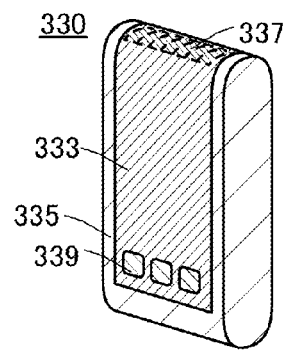
Figure 15G:
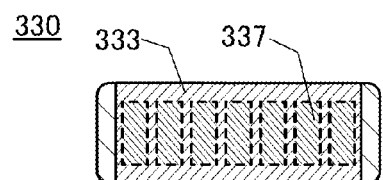
Figure 15H:
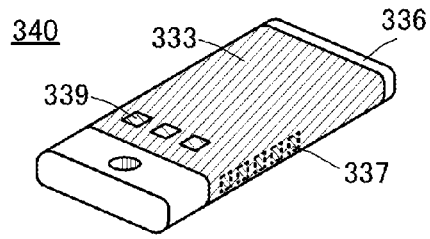

FIG. 15F is a perspective view illustrating an external shape of the portable information terminal 330. FIG. 15G is a top view of the portable information terminal 330. FIG. 15H is a perspective view illustrating an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 15F and 15H). In addition, information 337 indicated by dashed rectangles can be displayed on another surface (FIGS. 15G and 15H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 15F and 15G illustrate an example in which the information 337 is displayed at the top, one embodiment of the present invention is not limited thereto. The information may be displayed, for example, on the side as in the portable information terminal 340 illustrated in FIG. 15H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A touch panel of one embodiment of the present invention can be used for a display portion 333 mounted in each of a housing 335 of the portable information terminal 330 and a housing 336 of the portable information terminal 340. According to one embodiment of the present invention, a highly reliable touch panel having a curved display portion can be provided with a high yield.

Figure 15I:
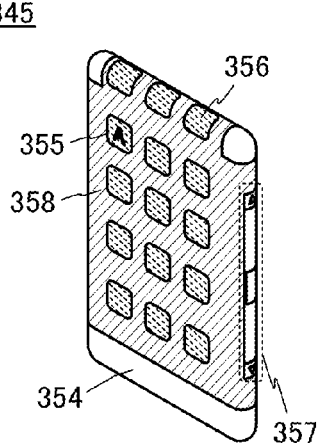

As in a portable information terminal 345 illustrated in FIG. 15I, data may be displayed on three or more surfaces. Here, data 355, data 356, and data 357 are displayed on different surfaces.

The touch panel of one embodiment of the present invention can be used for a display portion 358 included in a housing 354 of the portable information terminal 345.

According to one embodiment of the present invention, a highly reliable touch panel having a curved display portion can be provided with a high yield.

This embodiment can be combined with any other embodiment as appropriate.

This application is based on Japanese Patent Application serial no. 2014-091825 filed with Japan Patent Office on Apr. 25, 2014, the entire contents of which are hereby incorporated by reference.

What is claimed is:

1. An input and output device comprising:
a first flexible substrate;
a second flexible substrate;
a first buffer layer between the first flexible substrate and the second flexible substrate;
a first crack inhibiting layer in contact with the first buffer layer;
a sealing layer,
an input device including a transistor and a sensor element; and
a light-emitting element,
an external connection terminal,
wherein the input device and the light-emitting element are provided between the first buffer layer and the second flexible substrate,
wherein the sensor element includes a pair of electrodes and a dielectric layer,
wherein the sealing layer bonds the first flexible substrate and the second flexible substrate,
wherein one of the pair of electrodes is in contact with the sealing layer,
wherein the first crack inhibiting layer contains at least one of a first conductive material and a first resin material, and
wherein the first crack inhibiting layer surrounds the input device and the external connection terminal when seen from a direction perpendicular to a surface of the first flexible substrate.

2. The input and output device according to claim 1,
wherein the dielectric layer is provided between the pair of electrodes,
wherein the transistor and the sensor element are electrically connected to each other, and
wherein the light-emitting element is provided between the second flexible substrate and the input device.

3. The input and output device according to claim 1,
wherein the first buffer layer contains an inorganic material,
wherein the light-emitting element contains a light-emitting organic compound, and
wherein the first crack inhibiting layer is positioned between the sensor element and an end portion of the first flexible substrate when seen from the direction perpendicular to the surface of the first flexible substrate.

4. The input and output device according to claim 1, further comprising a second buffer layer and a second crack inhibiting layer,
wherein the second crack inhibiting layer contains at least one of a second conductive material and a second resin material,
wherein the second buffer layer is provided between the second flexible substrate and the light-emitting element, and
wherein the second crack inhibiting layer is in contact with the second buffer layer.

5. The input and output device according to claim 4,
wherein the second crack inhibiting layer is positioned between the light-emitting element and an end portion of the second flexible substrate when seen from a direction perpendicular to a surface of the second flexible substrate.

6. The input and output device according to claim 1,
wherein one of the pair of electrodes contains an oxide conductor.

7. The input and output device according to claim 1, further comprising a color filter,
wherein the color filter is provided between the first buffer layer and the second flexible substrate, and
wherein one of the pair of electrodes is positioned between the color filter and the second flexible substrate.

8. An input and output device comprising:
a first flexible substrate;
a second flexible substrate;
a first buffer layer between the first flexible substrate and the second flexible substrate;
a first crack inhibiting layer in contact with the first buffer layer;
a sealing layer,
an input device including a sensor element; and
a light-emitting element,
an external connection terminal,
wherein the input device and the light-emitting element are provided between the first buffer layer and the second flexible substrate,
wherein the sensor element includes a pair of electrodes and a dielectric layer,
wherein the sealing layer bonds the first flexible substrate and the second flexible substrate,
wherein one of the pair of electrodes is in contact with the sealing layer,
wherein the first crack inhibiting layer contains at least one of a first conductive material and a first resin material, and
wherein the first crack inhibiting layer surrounds the input device and the external connection terminal when seen from a direction perpendicular to a surface of the first flexible substrate.

9. The input and output device according to claim 8,
wherein the first buffer layer contains an inorganic material,
wherein the light-emitting element contains a light-emitting organic compound, and
wherein the first crack inhibiting layer is positioned between the sensor element and an end portion of the first flexible substrate when seen from the direction perpendicular to the surface of the first flexible substrate.

10. The input and output device according to claim 8, further comprising a second buffer layer and a second crack inhibiting layer,
wherein the second crack inhibiting layer contains at least one of a second conductive material and a second resin material,
wherein the second buffer layer is provided between the second flexible substrate and the light-emitting element, and
wherein the second crack inhibiting layer is in contact with the second buffer layer.

11. The input and output device according to claim 8, further comprising a color filter, wherein the color filter is provided between the first buffer layer and the second flexible substrate, and
wherein one of the pair of electrodes is positioned between the color filter and the second flexible substrate.

12. An input and output device comprising:
a first flexible substrate;
a second flexible substrate;
a first buffer layer;
a first crack inhibiting layer;
a sealing layer,
an input device including a transistor and a sensor element; and
a light-emitting element,
an external connection terminal,
wherein a first surface of the first flexible substrate faces a second surface of the second flexible substrate,
wherein the sealing layer bonds the first surface and the second surface,
wherein the first buffer layer, the first crack inhibiting layer, and the input device are provided on the first surface side of the first flexible substrate,
wherein the first crack inhibiting layer contains at least one of a first conductive material and a first resin material,
wherein the first crack inhibiting layer surrounds the input device and the external connection terminal when seen from a direction perpendicular to the first surface,
wherein the first buffer layer includes a region overlapping with the first crack inhibiting layer,
wherein the sensor element includes a pair of electrodes and a dielectric layer,
wherein the dielectric layer is provided between the pair of electrodes,
wherein one of the pair of electrodes is in contract with the sealing layer,
wherein the transistor and the sensor element are electrically connected to each other, and
wherein the light-emitting element is provided on the second surface side of the second flexible substrate.

13. The input and output device according to claim 12,
wherein the first buffer layer contains an inorganic material,
wherein the light-emitting element contains a light-emitting organic compound, and
wherein the first crack inhibiting layer is positioned between the sensor element and an end portion of the first flexible substrate when seen from the direction perpendicular to the first surface.

14. The input and output device according to claim 12, further comprising a second buffer layer and a second crack inhibiting layer,
wherein the second crack inhibiting layer contains at least one of a second conductive material and a second resin material,
wherein the second buffer layer and the second crack inhibiting layer are provided on the second surface side of the second flexible substrate, and
wherein the second buffer layer includes a region overlapping with the second crack inhibiting layer.

15. The input and output device according to claim 14,
wherein the second crack inhibiting layer is positioned between the light-emitting element and an end portion of the second flexible substrate when seen from a direction perpendicular to the second surface.

16. The input and output device according to claim 12, wherein one of the pair of electrodes contains an oxide conductor.

17. The input and output device according to claim 12, further comprising a color filter,
wherein the color filter is provided on the first surface side of the first flexible substrate,
wherein one of the pair of electrodes is positioned between the color filter and the second flexible substrate.

18. A module comprising:
the input and output device according to claim 12; and
a flexible printed circuit.

19. An electronic device comprising:
the input and output device according to claim 12; and
one of a speaker, a microphone and an operation button.

* * * * *

UNITED STATES PATENT AND TRADEMARK OFFICE
CERTIFICATE OF CORRECTION

PATENT NO. : 9,960,213 B2
APPLICATION NO. : 14/690834
DATED : May 1, 2018
INVENTOR(S) : Naoyuki Senda et al.

It is certified that error appears in the above-identified patent and that said Letters Patent is hereby corrected as shown below:

In the Claims

Column 45, Line 36, in Claim 12, replace "contract" with --contact--.

Signed and Sealed this
Twenty-first Day of August, 2018

Andrei Iancu
*Director of the United States Patent and Trademark Office*